United States Patent [19]

Jeppsson et al.

[11] Patent Number: 4,782,325

[45] Date of Patent: Nov. 1, 1988

[54] ARRANGEMENT FOR DATA COMPRESSION

[76] Inventors: Hakan Jeppsson, Grey Turegatan 49 ltr, S-114 38 Stockholm; Tina Jeppsson, Smedslättsvägen 66, S-161 39 Bromma; Martin V. I. Jeppsson, Box 17049, 161 17 Bromma, all of Sweden

[21] Appl. No.: 905,237

[22] Filed: Sep. 9, 1986

Related U.S. Application Data

[63] Continuation-in-part of Ser. No. 687,725, Dec. 31, 1984, abandoned.

[30] Foreign Application Priority Data

Dec. 30, 1983 [SE] Sweden .............................. 8307228

[51] Int. Cl.$^4$ ............................................. H03M 7/30
[52] U.S. Cl. ...................................... 341/55; 364/900
[58] Field of Search ................ 340/347 DD; 364/200, 364/900

[56] References Cited

U.S. PATENT DOCUMENTS 4,386,416  3/1983  Giltner ................................ 364/900

OTHER PUBLICATIONS

Huffman, "A Method for the Construction of Minimum Redundancy Codes", Proc. IRE, 40(9), 1952.
C. J. Date, An Introduction to Database Systems, 3rd, Ed., Addison-Wesley Publishing Company, pp. 51–52.
James Martin, Computer Data Base Organization, Prentice-Hall, pp. 517–526.
Gilbert Held, Data Compression, John Wiley and Sons, 1983, pp. 60–71.

Primary Examiner—Charles D. Miller

[57] ABSTRACT

For reducing the redundancy ratio of an entity key set, from very high ratios when encoded into conventional I/O code-words, down to a ratio close to zero, a non-redundant number code representation is employed in an encoder/decoder in lieu of a conventional multiple code-word representation, each member of the number code representing a member of the entity key set. Such a number code encoder/decoder may hold in store and provide access to an entity key set representing a set of 65535 different textual or lexical words, thereby using a 16 bit fixed length number code. Code-words representing such code numbers would require 16 bits of storage each if being held in store, however, such code numbers are produced using two alternative methods, (i) as relative address values of individual storage locations within a string of storage locations, e.g., a string of 8 bit byte locations, or (ii) as marked bit counts within a bit map representing the stored set. An embodiment using a byte string representation would require just a little more than 8 bits of storage for each entity key, while an embodiment using the bit map representation would require just a little more than 1 bit of storage for each entity key. These extreme values are achieved for entity key sets having low redundancy ratios prior to redundancy reduction. In many applications, the degree of compression may be maximized by combining the two types of representation, using the bit mapping technique in those parts of the system where the redundancy ratio is lowest.

To enable a compressed representation of files within a file handling system, for example, the 16 bit code-words mentioned above may be applied to represent repeatedly occurring file segments for compact file storage as well as for fast file transfer. Provided the relative frequencies of occurrence can be statistically determined for the different code-words, a variable length type of code may be designed to further reduce average code length. The well-known Huffman code is an optimum code for this purpose.

20 Claims, 24 Drawing Sheets

ALPHIT CODE-WORD VALUES WITH CORRESPONDING
ASCII I/O CODE-WORD VALUES & CODE SYMBOLS
BINARY TREE REPRESENTATION

FIG. 2A

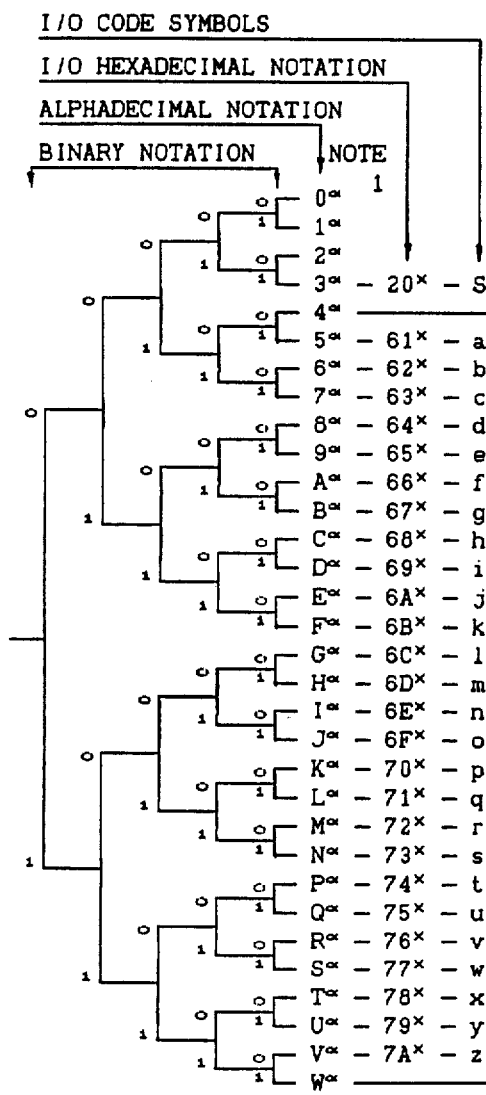

NOTE 1

$0^\alpha$ = SYSTEM CONTROL FUNCTION
$1^\alpha$ = SYSTEM CONTROL FUNCTION
$2^\alpha$ = SYSTEM CONTROL FUNCTION
$40^\alpha$ = SYSTEM CONTROL FUNCTION

NOTE 2

SUB-SETS FOR MORE I/O CODE-WORDS:
$4^\alpha$ INITIATES A JUMP TO HIGH LEVEL,
$W^\alpha$ TO LOW LEVEL SUB-SET. HIGH OR
LOW GOVERNS THE SORTING ORDER.

NIBBLE CODE-WORD VALUES WITH CORRESPONDING
ASCII I/O CODE-WORD VALUES & CODE SYMBOLS
BINARY TREE REPRESENTATION

NOTE 1

SYSTEM INTERNAL CODE-WORDS:
FD$^x$ = SYSTEM CONTROL FUNCTION
FE$^x$ = SYSTEM CONTROL FUNCTION

NOTE 2

F$^x$ = JUMP TO NEXT LOWER SUB-SET
FF$^x$ = JUMP TO NEXT LOWER SUB-SET
FFF$^x$ = JUMP TO NEXT LOWER SUB-SET

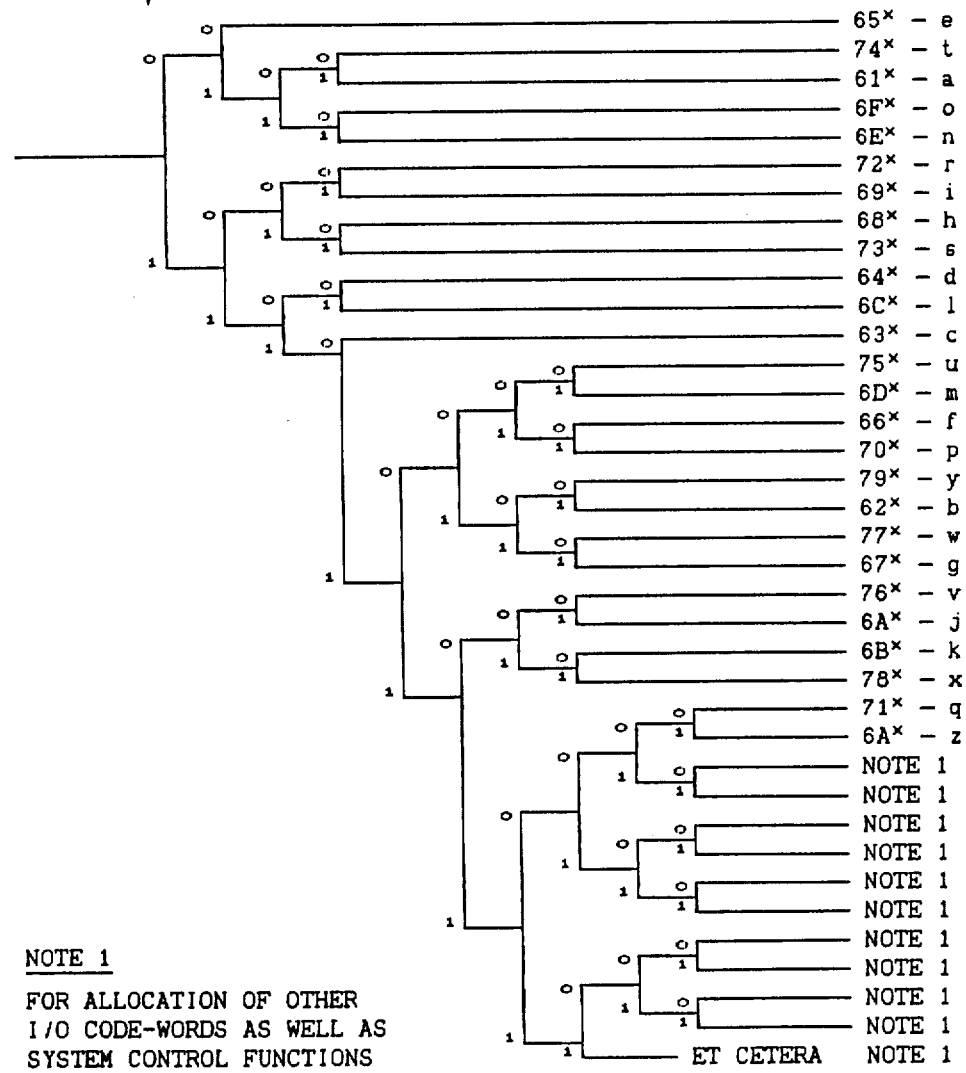

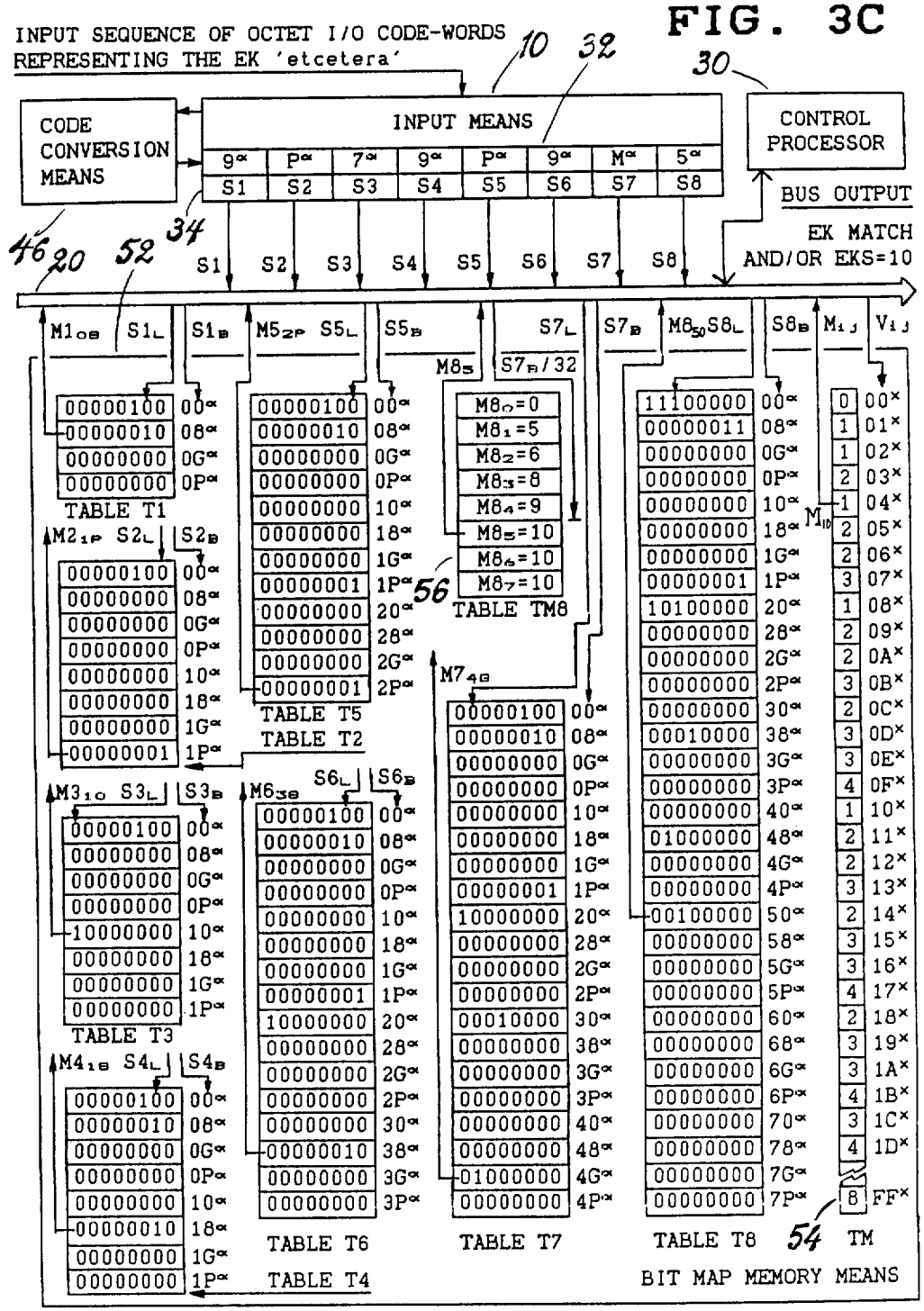

ARRANGEMENT FOR DATA COMPRESSION

This is a continuation-in-part application of Ser. No. 687,725 filed Dec. 31, 1984, of Hakan Jeppsson and Tina Jeppsson, entitled "Arrangement For Data Compression".

TECHNICAL FIELD

The present invention relates to processes and apparatus for storage and transfer of data in computer systems and more particularly to arrangements for storage and transfer of compressed data. Two related arrangements, for use in combination or separately, facilitate compact storage of a set of entity keys for fast response to any input of an individual entity key code representation. Entity key systems using these arrangements have many potential applications. Fast access to data items within large entity record sets is facilitated. Further, such entity key systems may be used for compact storage and fast transfer of the entity records themselves. A file handling system, considered as part of the present invention, may use any one or a combination of the two arrangements to provide non-redundant sets of entity key code-words to represent file segments, thereby enabling compact storage and fast transfer of files of various kinds.

BACKGROUND OF THE INVENTION

Known methods for achieving a compact data system storage of an entity key set include front-end and rear-end compression techniques, explained by C. J. Date in the third edition of 'An Introduction to Database Systems', Addison-Wesley pages 51–52, and by James Martin in the second edition of 'Computer Data-Base Organization', Prentice-Hall, pages 517–526. A well known word processing program named 'Word Plus' is using a similar method to compress a set of textural words, for use as a correct-spelling reference. A developed version of this program requires 158,000 bytes of storage to hold 54,000 different Swedish words.

The efficiency of data compression arrangements constructed and operating according to this invention may be enhanced by using conventional Huffman coding techniques. In 1952 David A. Huffman's paper 'A Method for the construction of Minimum-Redundancy Codes' was published in Proc. IRE, 40(9). More recently the Huffman coding technique was explained by Gilbert Held in a Wiley Heyden Publication 'Data Compression', copyright 1983 and reprinted 1984.

DISCLOSURE OF INVENTION

An object of the present invention is to provide efficient means for reducing the redundancy ratio of an entity key set, from very high ratios when encoded into conventional I/O code-words, down to a ratio close to zero. A non-redundant number code representation is employed in lieu of a conventional multiple code-word representation, each member of the number code representing a member of the entity key set. For example, such a number code encoder/decoder may hold in store and provide access to an entity key set representing a set of 65535 different textual or lexical words, thereby using a 16 bit fixed length number code. Code-words representing such code numbers would require 16 bits of storage each if being held in store, however, according to the present invention such code numbers are produced using two alternative methods, (i) as relative address values of individual storage locations within a string of storage locations, e.g. a string of 8 bit byte locations, or (ii) as marked bit counts within a bit map representing the stored set. In the most favourable case an embodiment using a byte string representation would require just a little more than 8 bits of storage for each entity key, while an embodiment using the bit map representation would require just a little more than 1 bit of storage for each entity key. These extreme values are achieved for entity key sets having low redundancy ratios prior to redundancy reduction. In many applications the degree of compression may be maximized by combining the two bytes of representation, using the bit mapping technique in those parts of the system where the redundancy ratio is lowest.

A further object of the present invention is to provide means for fast access to individual records of large data bases by making use of an inherent fast processing property of the redundancy reducing means mentioned above. Such means have also the inherent property of providing fast sorting at input of previously not stored entity keys.

Another object of the present invention is to provide means to enable a compressed representation of files within a file handling system. For example, the 16 bit code-words mentioned above may be applied to represent repeatedly occurring file segments, for compact file storage as well as for fast file transfer. Provided the relative frequencies of occurrence can be statistically determined for the different code-words, a variable length type of code may be designed to further reduce average code length. The well known Huffman code is an optimum code for this purpose, having a prefix-free property which means that no short code-word is duplicated as the beginning of a longer code-word.

Still another object of the present invention is to provide means for handling files containing also infrequently occurring segments. The above described techniques are used to compress only frequently occurring file segments, however, any other segment may be taken care of by applying a conventional Huffman code on each element of such an infrequent segment, i.e. on a symbol by symbol basis. A shift to such a symbol by symbol mode is being initiated by means of one specific prefix-free code-word, followed by a short fixed length code-word. The value of the second code-word determines the length of each individual symbol by symbol mode sequence.

A first type of entity key system according to the invention provides an input response in the form of an indication of whether an individual entity key that is being input is identical to any member of a set of entity keys that is held in store. An example is the use of an entity key system as a correct-spelling reference, where the set of entity keys that is held in store is a set of frequently occurring textual words and the entity key input is an individual textual word from a running text that is being tested. The present invention facilitates storage of these 54000 different Swedish words mentioned above, however, with a further reduction of storage space requirements and, more important, a dramatic reduction of the response time.

A second type of entity key system according to the invention provides an input response in the form of either (i) an EKS code-word, i.e. an Entity Key Sequence-number representation that uniquely identifies an individual entity key within an entity key set or (ii) a reject signal in case an invalid entity key has been input.

This second type of entity key system can, for example, serve as a vocabulary reference, providing EKS representations of common textual words and phrases. The purpose of this use of the entity key system is to provide compact system representations of all or most segments of any file, each such compact system representation being an encoded EKS, for such use being referred to as a Reference Segment Sequence-number code-word or RSS code-word. A substantial compression of text files can be achieved by substituting relevant RSS code-words for frequently occurring text segments, such as common words and phrases. The degree of compression may be enhanced by applying variable length code-words to represent more or less frequently occurring segments as well as more or less frequently occurring individual symbols of unfrequently occurring segments. When regenerating original text, the code-words are decoded to form relevant text segments, i.e. textual words and phrases.

A third type of entity key system according to the invention provides an input response in the form of either (i) a pointer address uniquely related to the entity key being input or (ii) a reject signal in case an invalid entity key has been input. Any data associated with the entity key may be transferred to and/or output from an external device, the location within such a device being found by use of the pointer address. An example of use of this third type of entity key system would be as a tool to provide fast access to the entity records of a complete computer based encyclopedia. Each entry is assumed to be a lexical word, hence lexical words are being used as entity keys in this case.

Each one of the three system types mentioned above may also be operating in an entity key input state, facilitating storage of entity keys being input, thereby of necessity performing a sorting operation.

BRIEF DESCRIPTIONS OF THE DRAWINGS

FIG. 1A represents a case where the EK input sequence is 'abc'. EK is used in the following as short for Entity Key.

FIG. 1B shows how a previously not stored EK is being stored.

FIG. 1C illustrates the reversed process of outputting an EK I/O code-word representation in response to an input of an EKS, i.e. a particular EK sequence number.

Figure 1A:
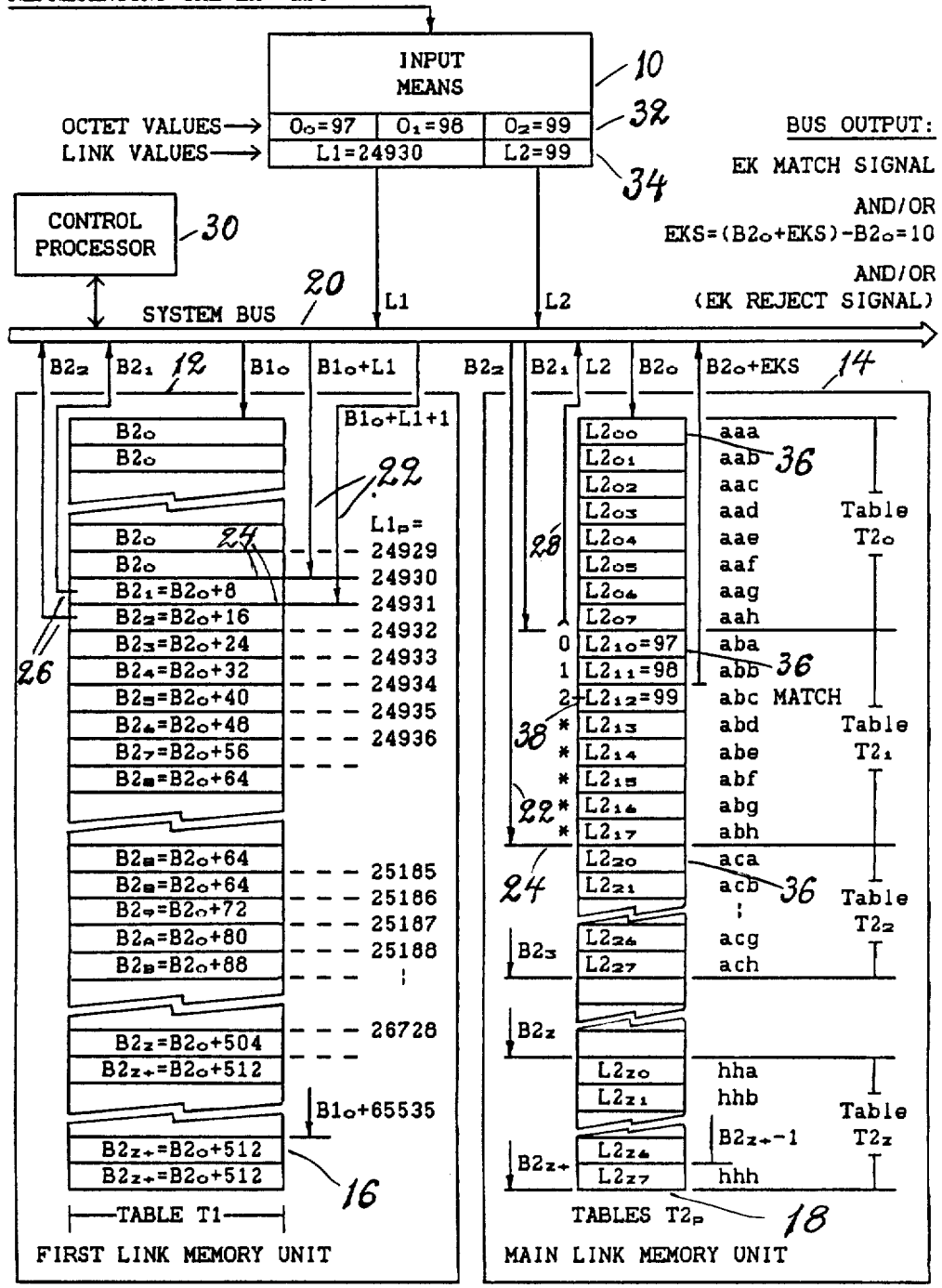
FIGS. 1A-1F illustrate different basic features of entity key system embodiments using unsophisticated input means and only two linked digital words for interfacing input means with memory means.
Figure 1B:
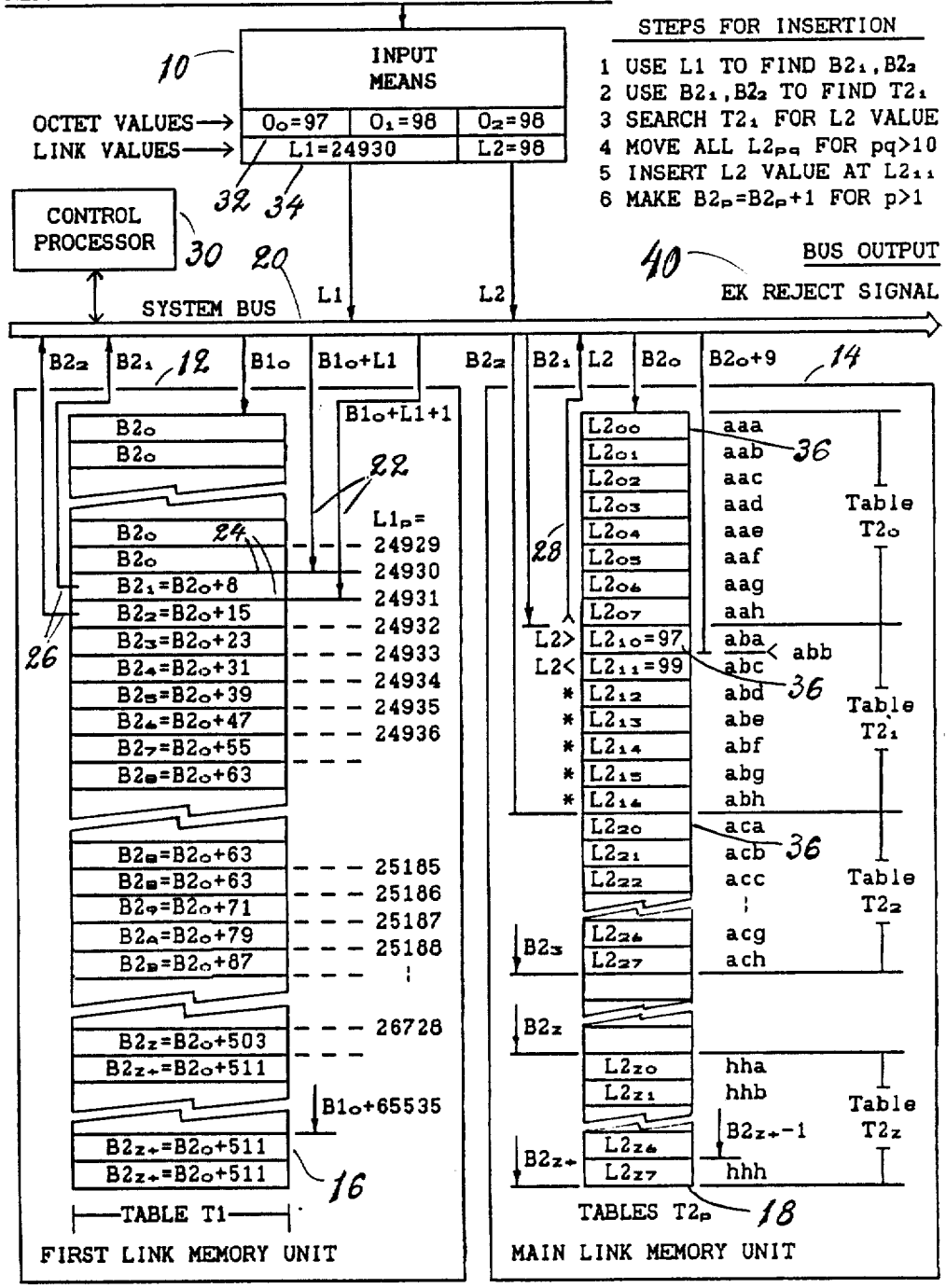
Figure 1C:
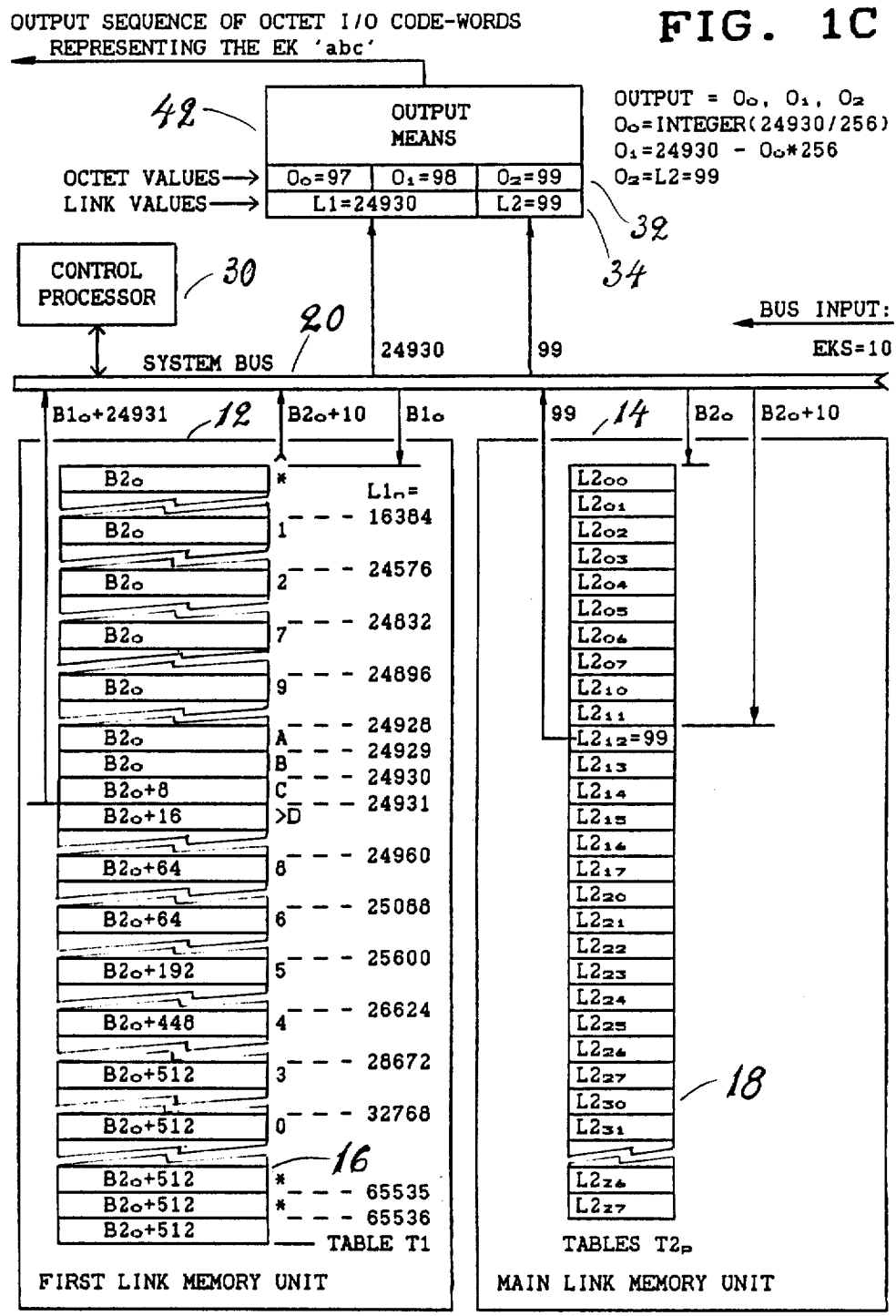
Figure 1D:
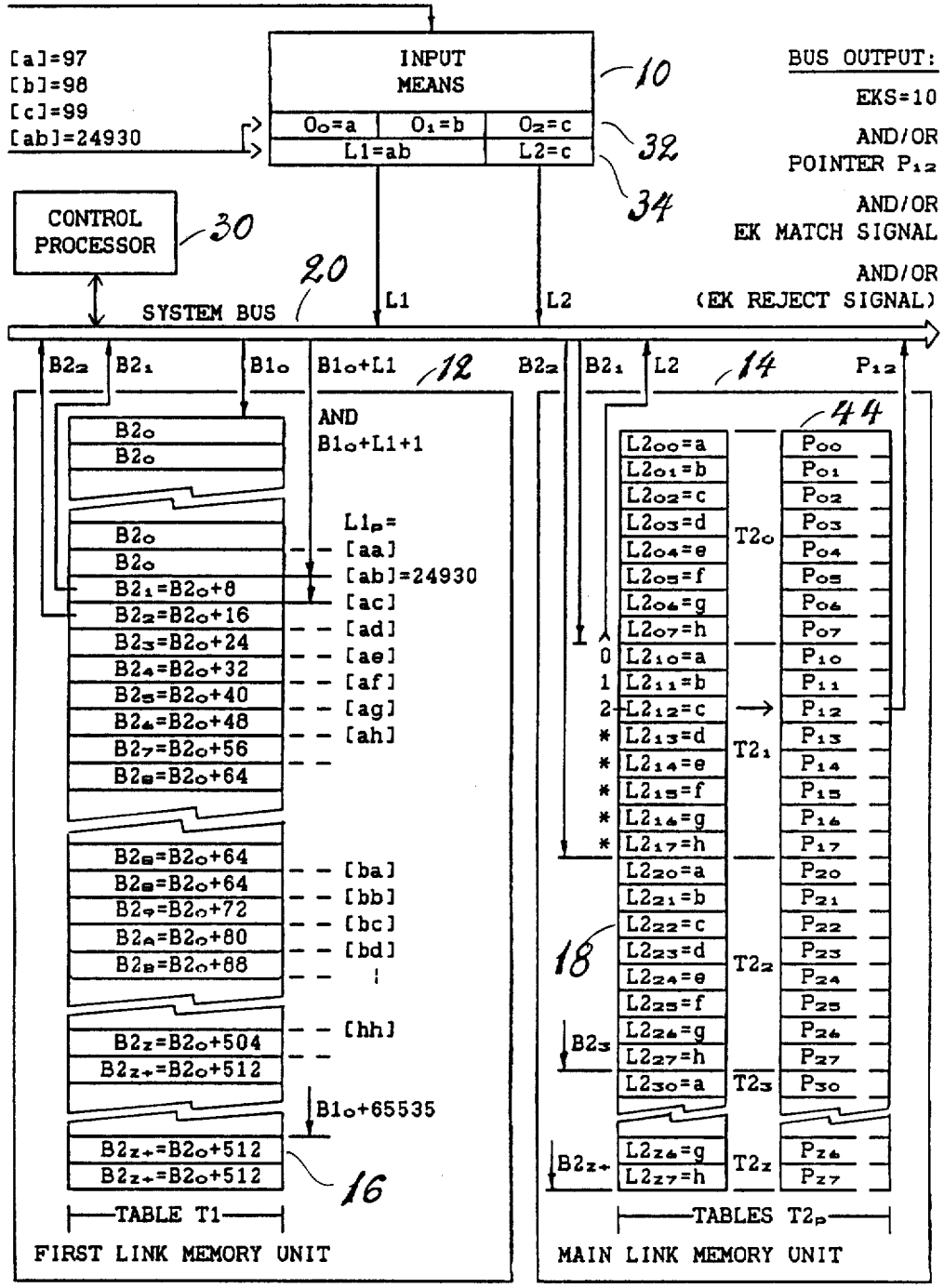
Figure 1E:
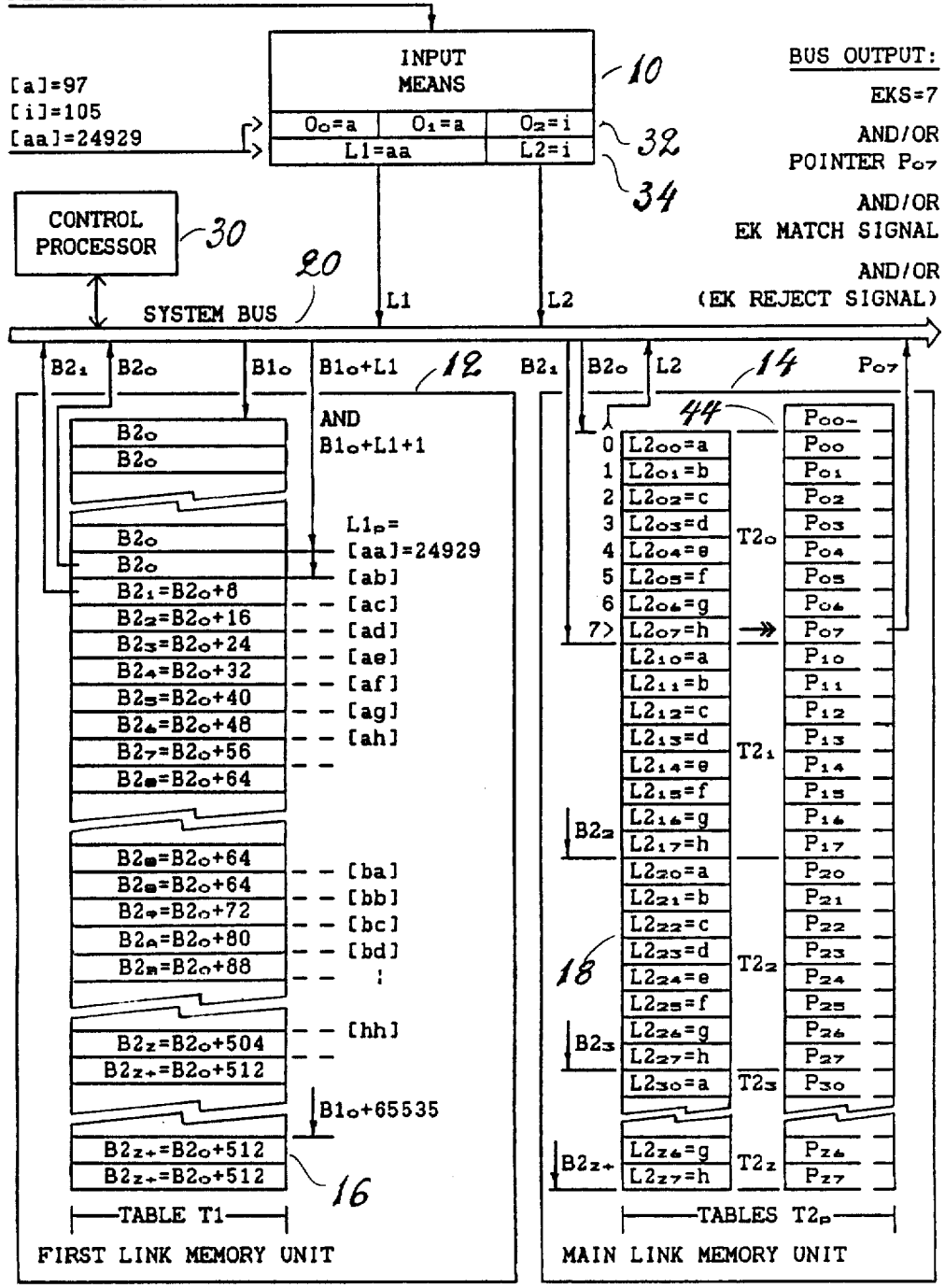
Figure 1F:
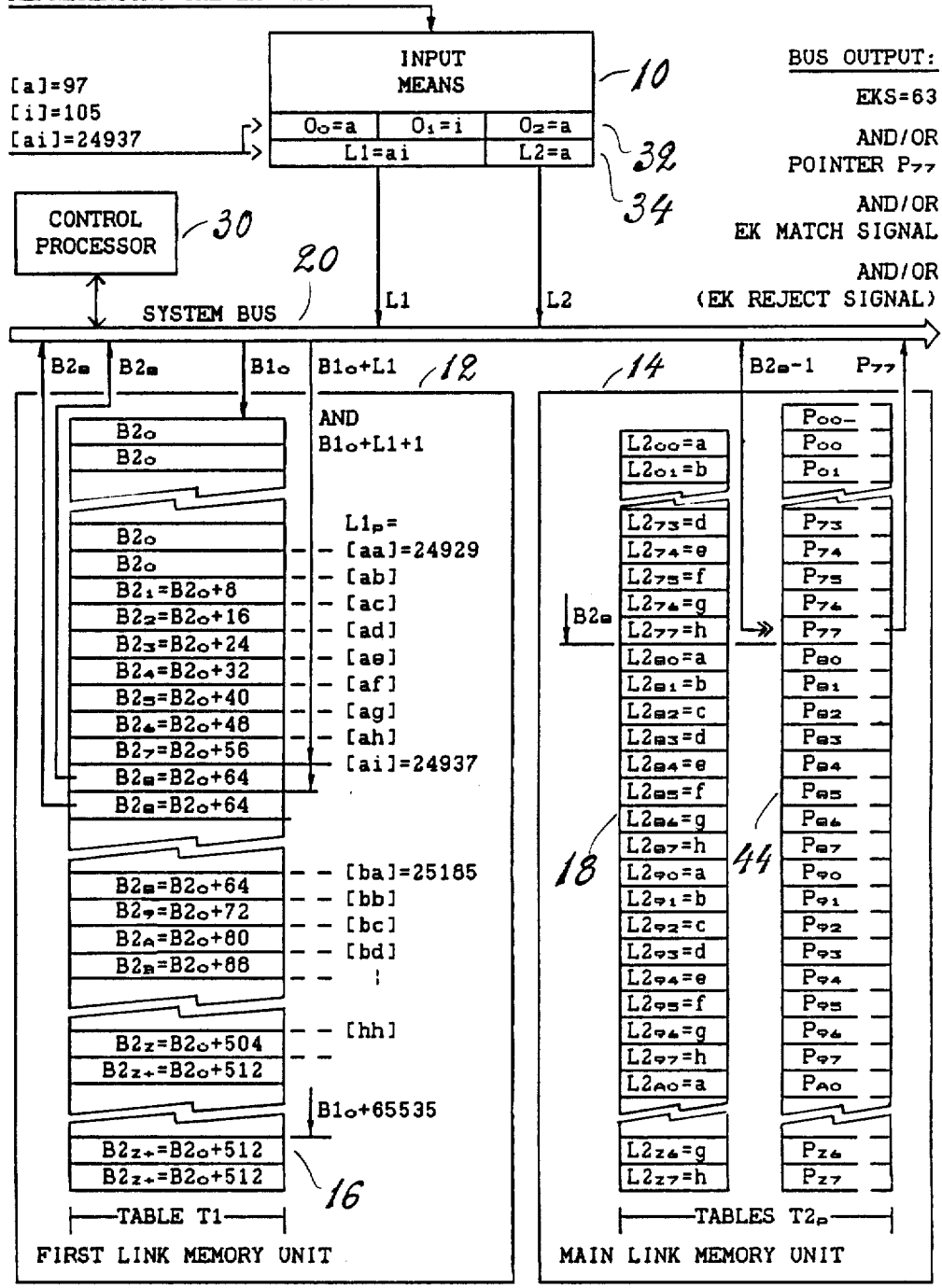

FIGS. 1D-1F relate to EK systems having means for outputting pointer addresses in response to EK I/O code-word inputs. The embodiment shown in FIG. 1D is operating in an EK matching mode and the one shown in FIGS. 1E & 1F in an EK non-matching mode.

Figure 2B:
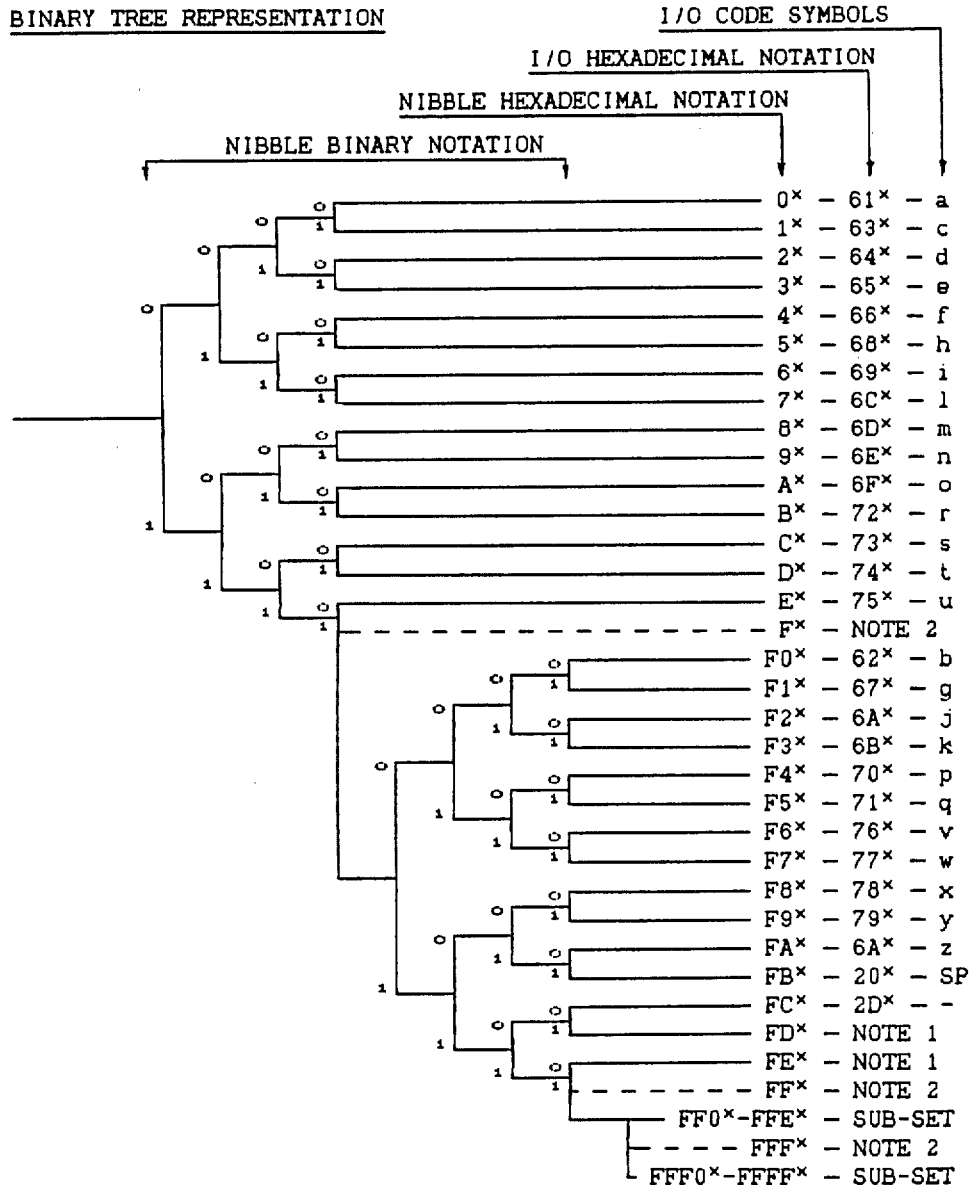

FIGS. 2A-2C illustrate three different coding schemes for code conversion from standard I/O codes to compact codes. FIG. 2A shows conversion to five-bit alphit code-words, FIG. 2B to four-bit nibble code-words and FIG. 2C to variable length code-words. These coding schemes are also applicable for retransforming compact code-word sequences into standard I/O code-word outputs.

Figure 3A:
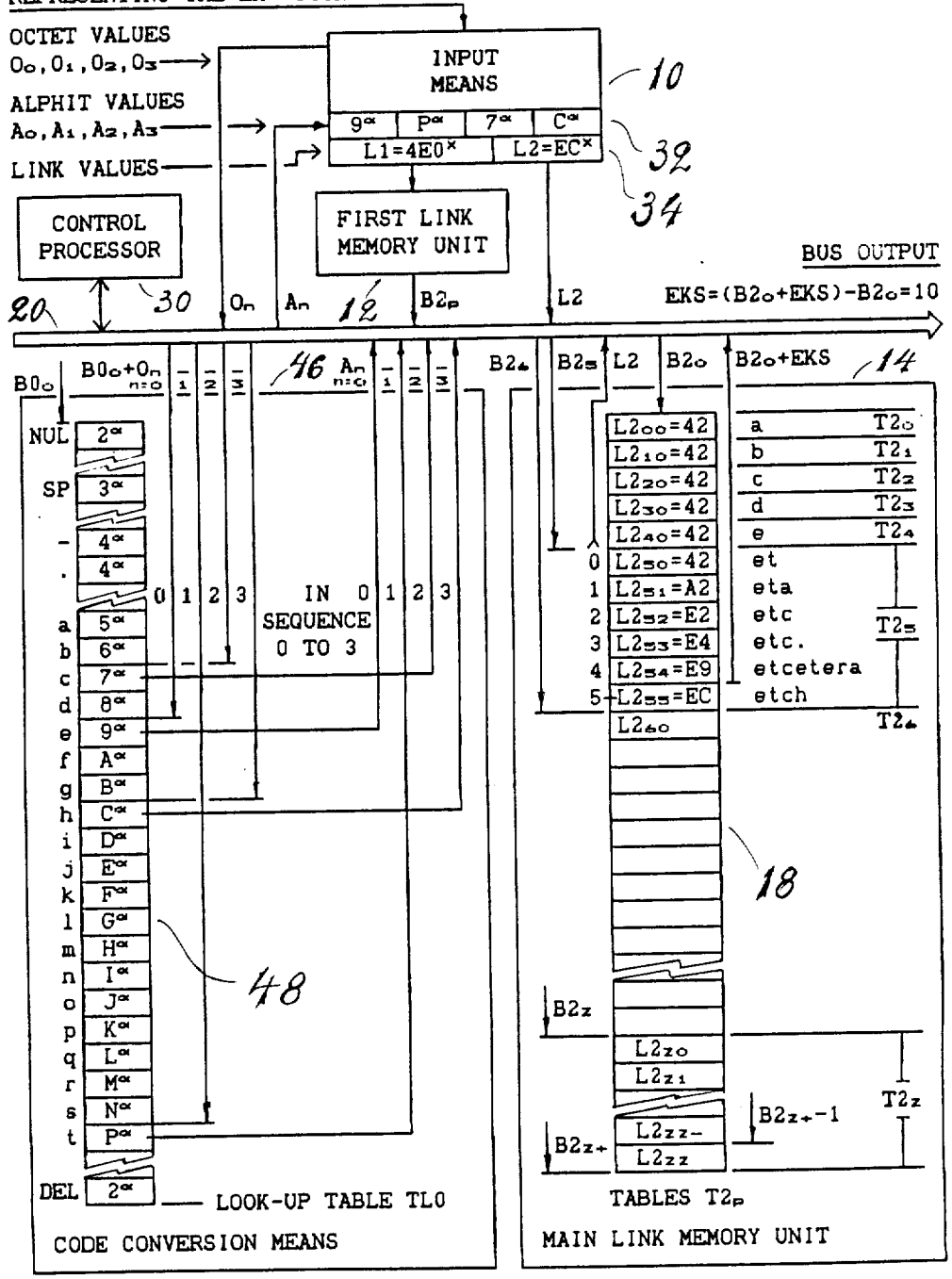
Figure 3B:
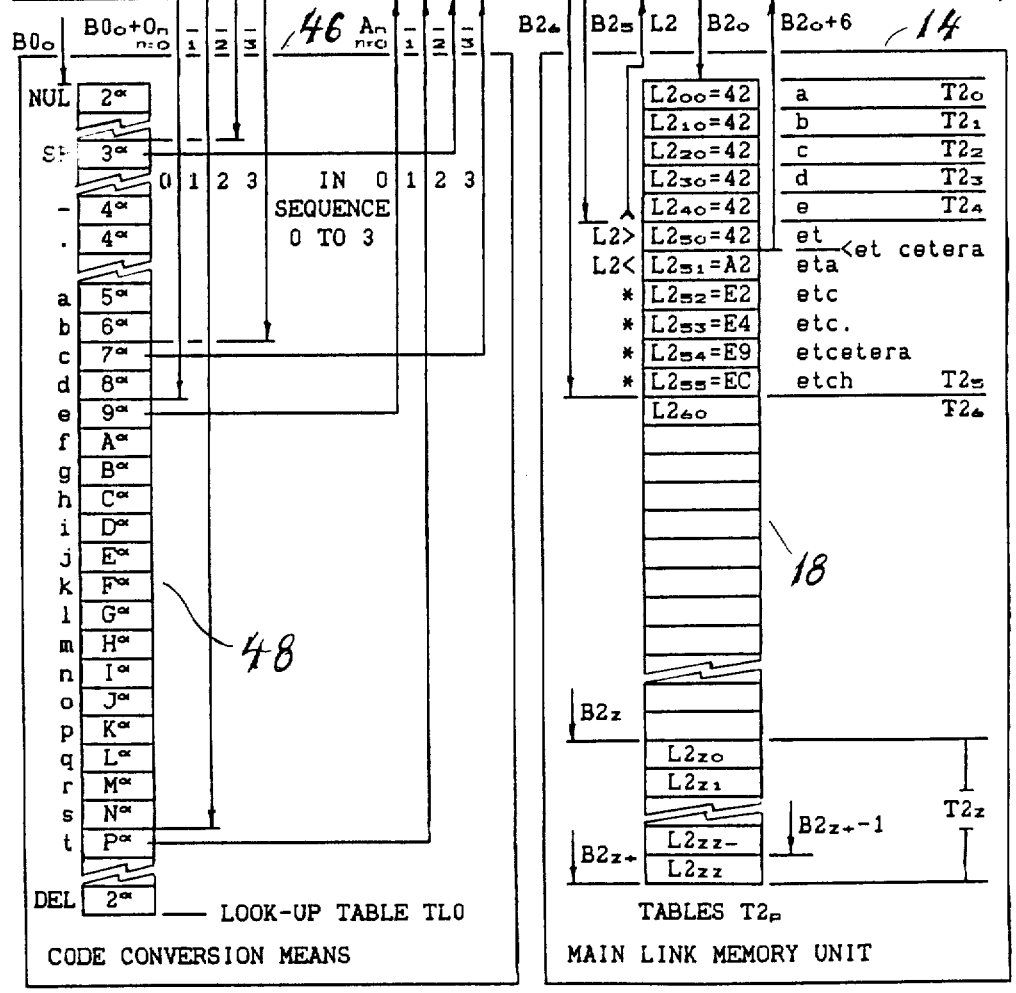

FIGS. 3A-3C relate to EK system embodiments with input means employing code conversion to 5-bit alphit code-words.

FIG. 3A shows an embodiment holding 11 different EKs in store. The input sequence is 'etch', a 32 bit sequence compacted to a 20 bit compact code representation.

FIG. 3B illustrates that the embodiment of FIG. 3A may be used to store the compounded word 'et cetera'. The figure also illustrates that an EK containing more symbols than can be represented still may produce a unique overall link value.

FIG. 3C shows an embodiment based on bit map memory means. The input sequence is 'etcetera'. The bit map holds a set of marked bits, representing the same eleven EKs as shown in FIG. 3A.

Figure 4A:
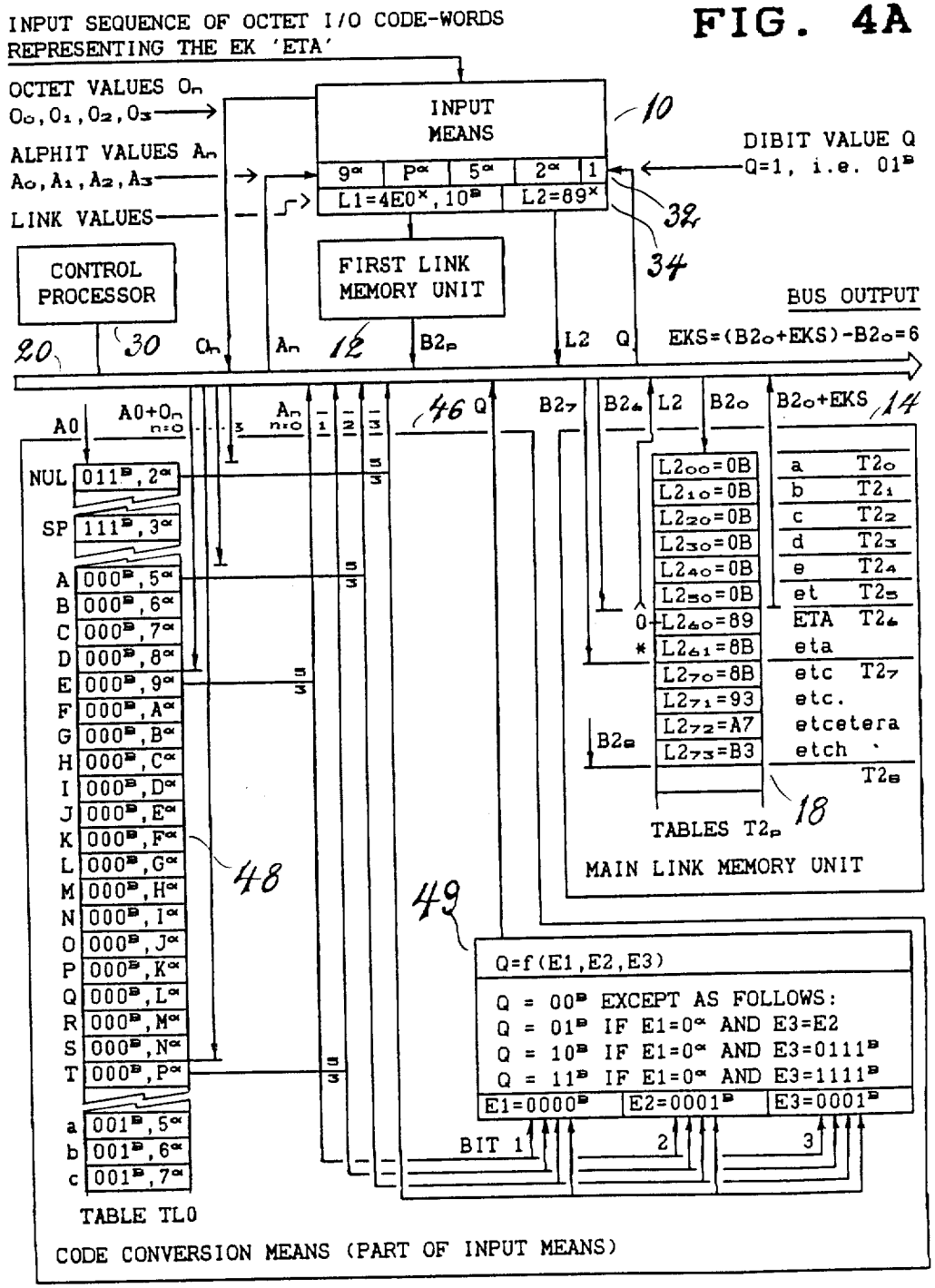
Figure 4B:
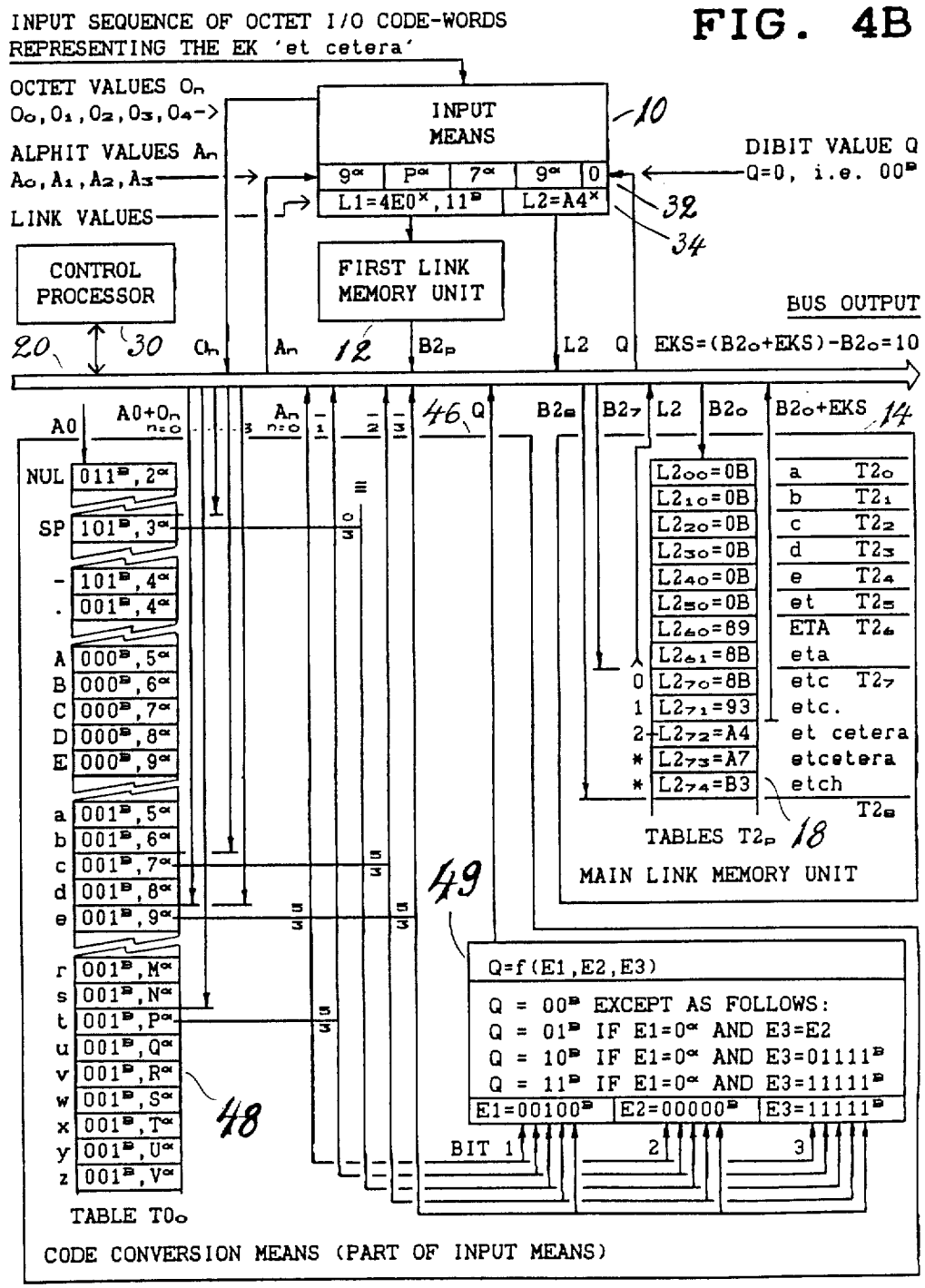

FIGS. 4A & 4B illustrate means for facilitating a proper sorting order when capital letters and compounded words are included. Code conversion to alphit code-words is employed.

Figure 5A:
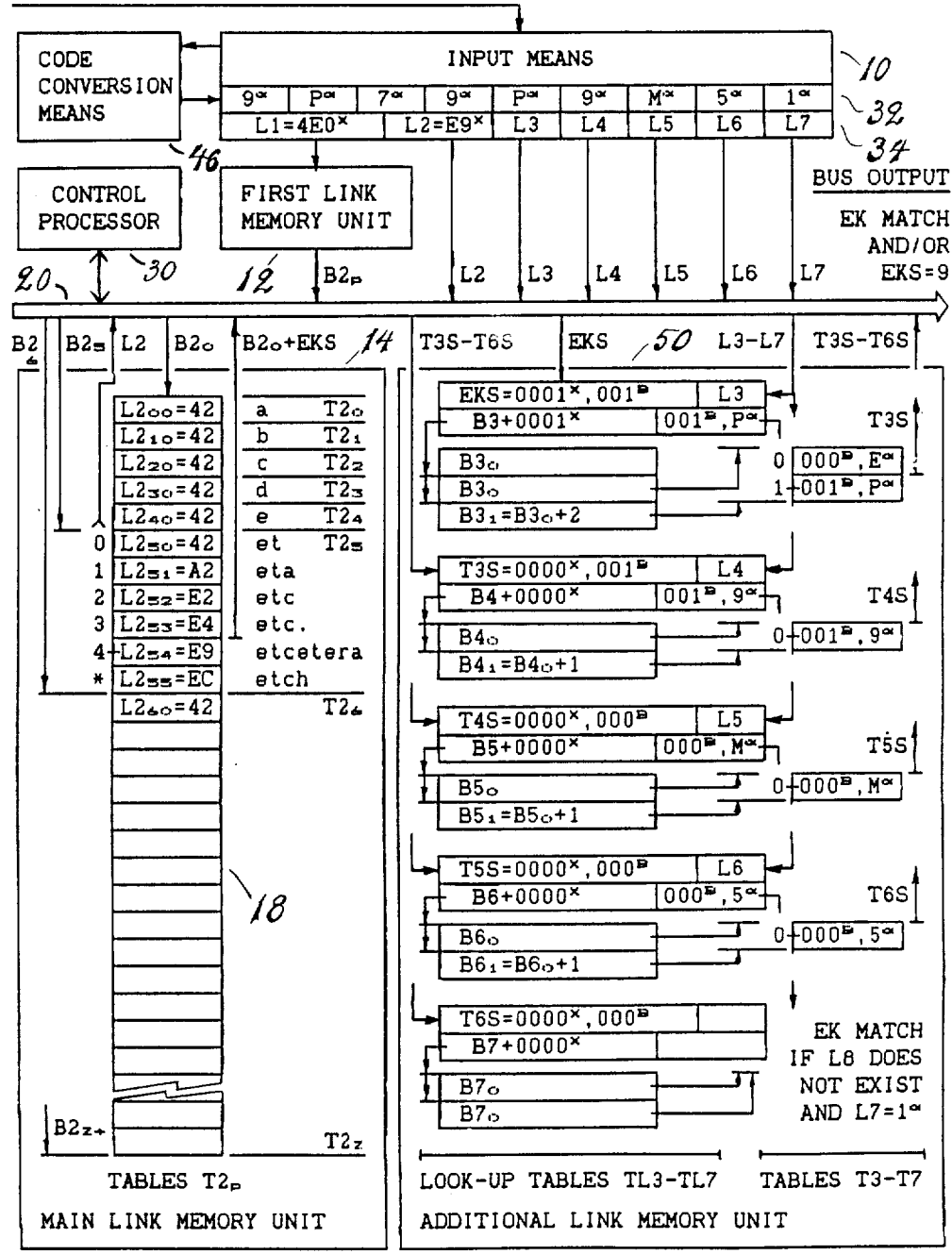
Figure 5B:
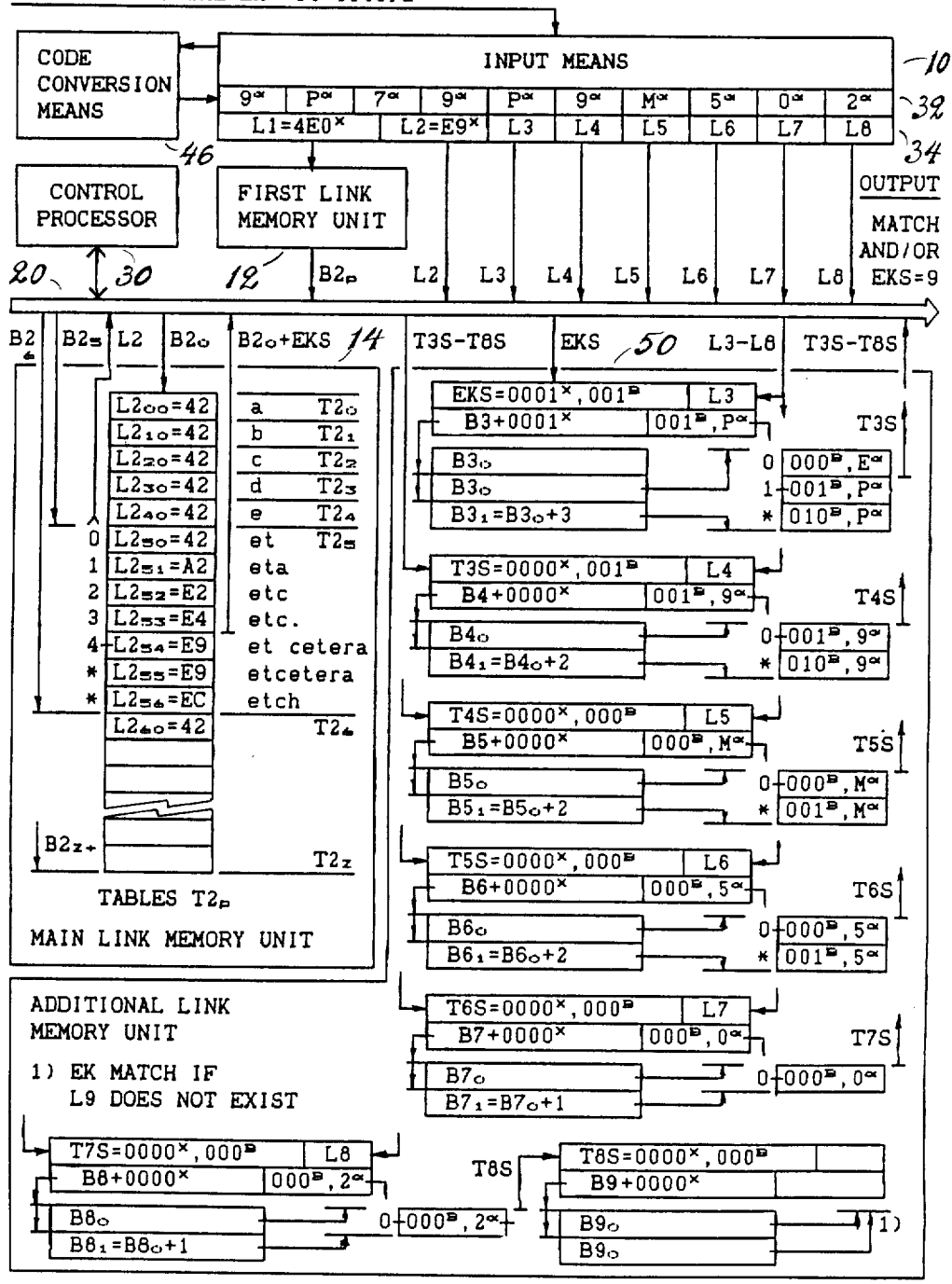

FIGS. 5A & 5B introduce the concept of additional links. Code conversion to alphit code-words is employed. FIG. 5B shows how a proper sorting order is facilitated also in this case.

FIGS. 6A-6D introduce the concept of intermediate links. Code conversion to alphit code-words is employed.

Figure 6A:
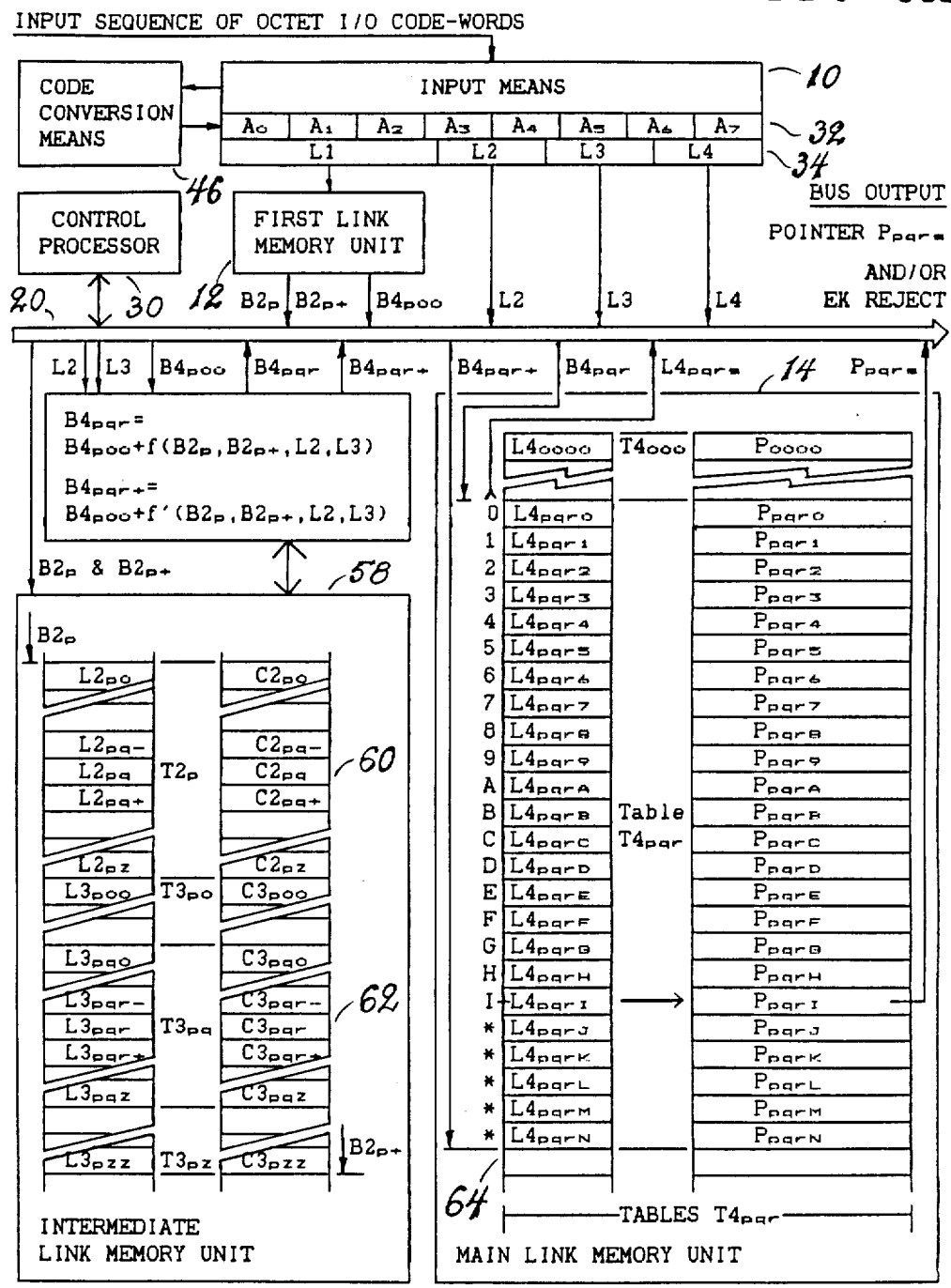

FIG. 6A explains the conventions applied for designating variables and values.

Figure 6B:
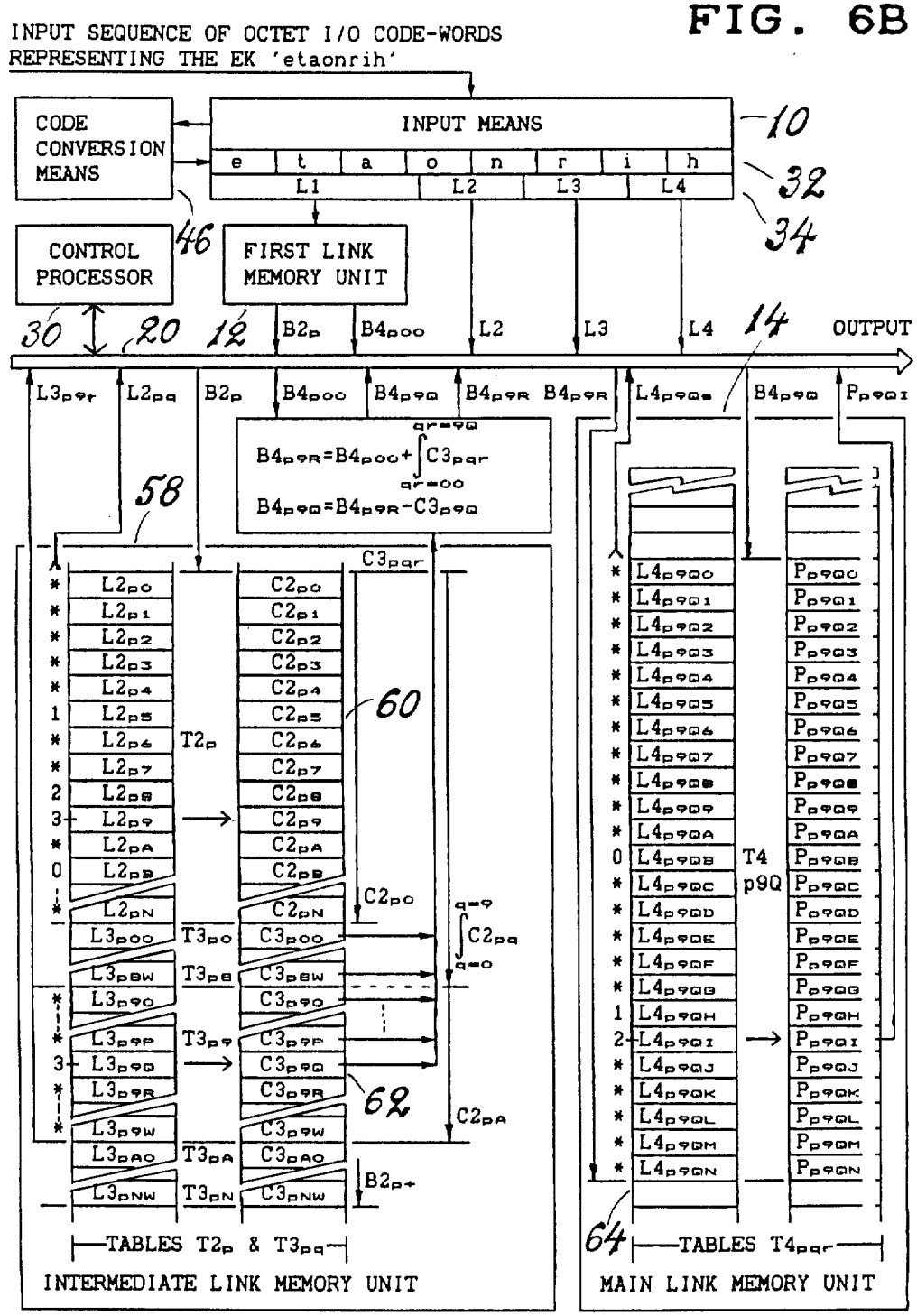
Figure 6C:
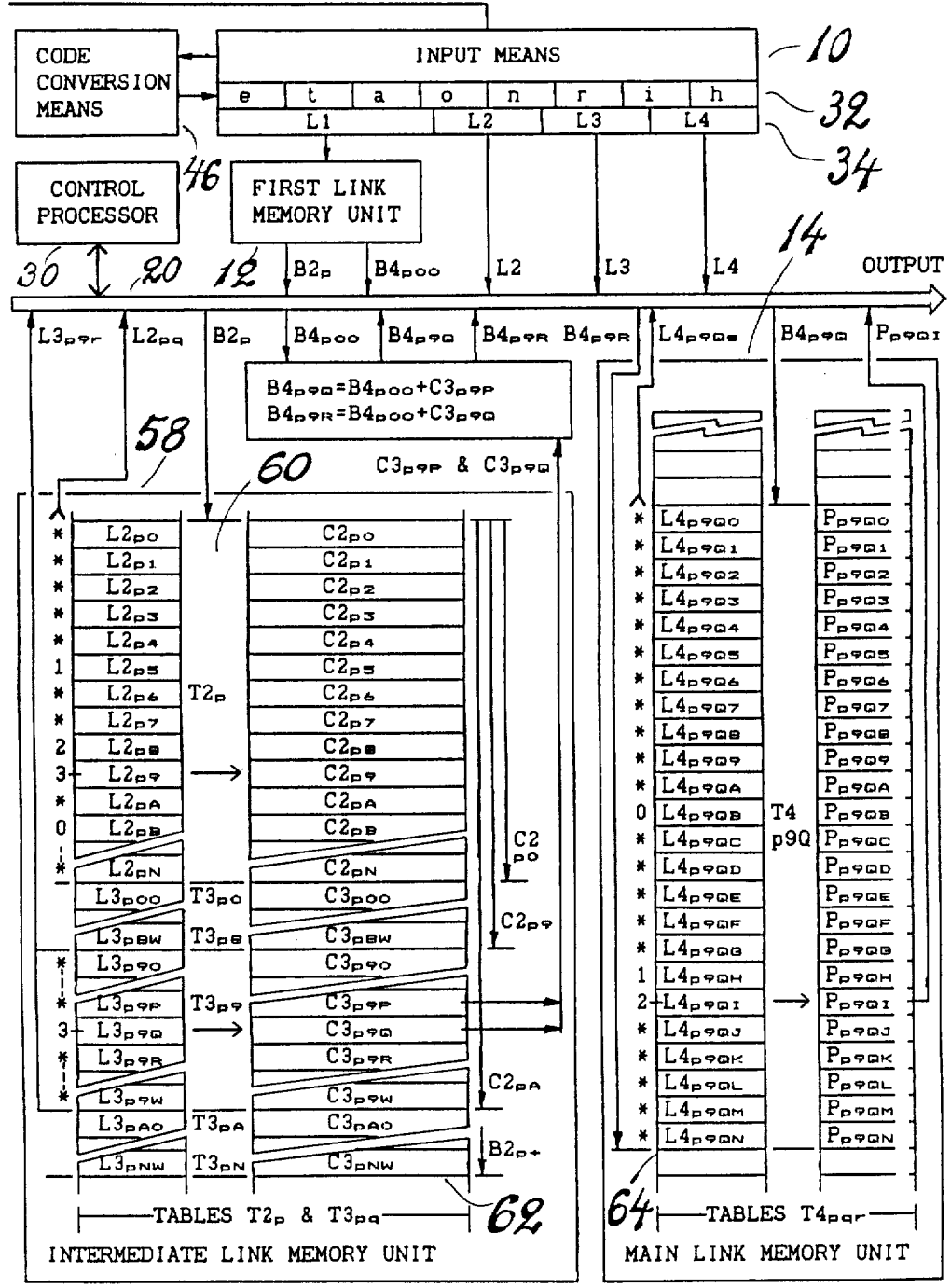

FIGS. 6B & 6C show embodiment variants, both using as input the sequence 'etaonrih'. The two variants use two different principles for storing address component values within the intermediate link unit.

Figure 6D:
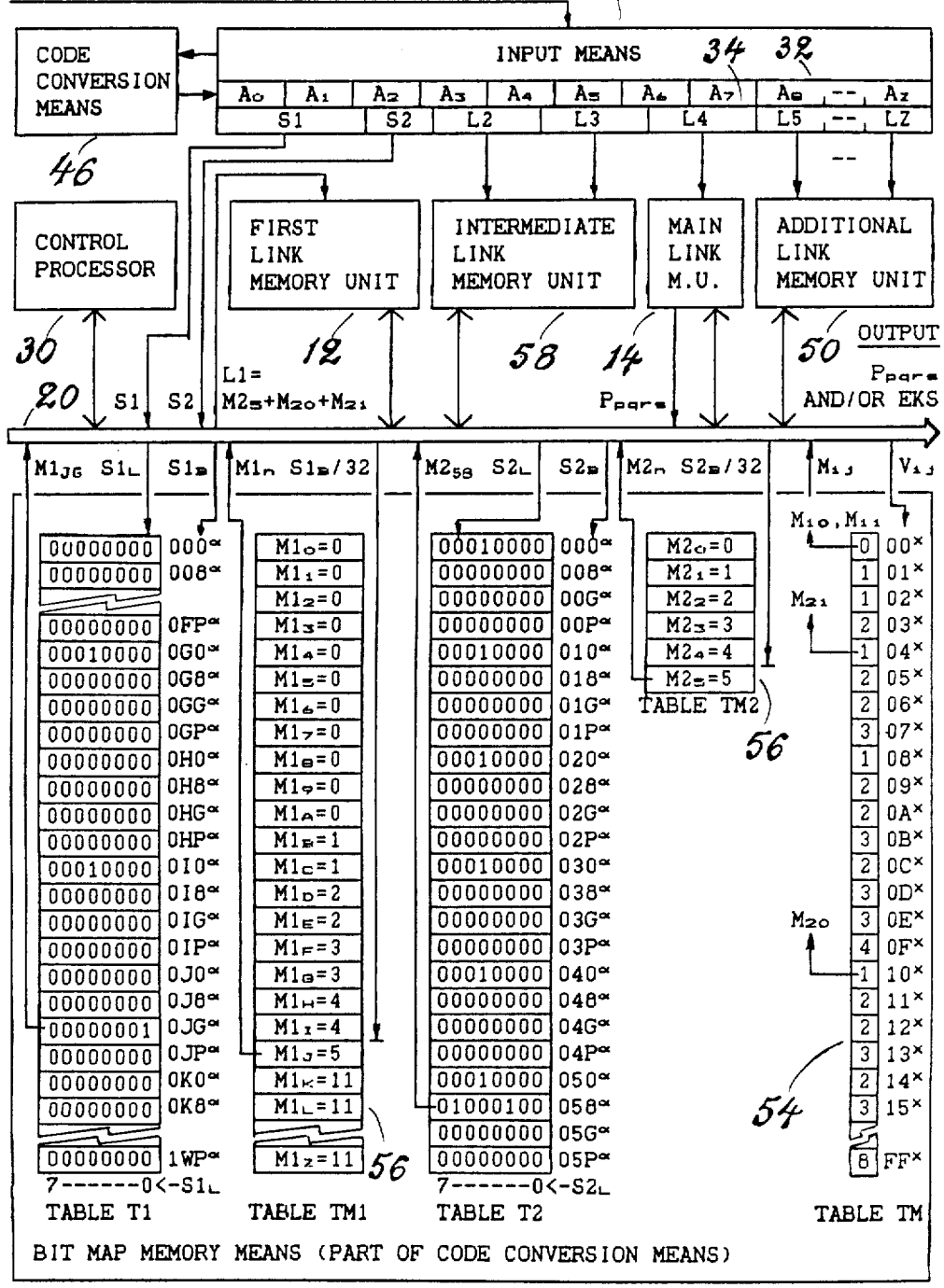

FIG. 6D illustrates how an EK system employing bit map memory means is used as part of code conversion means in an EK system embodiment otherwise employing ordinary memory means.

Figure 6E:
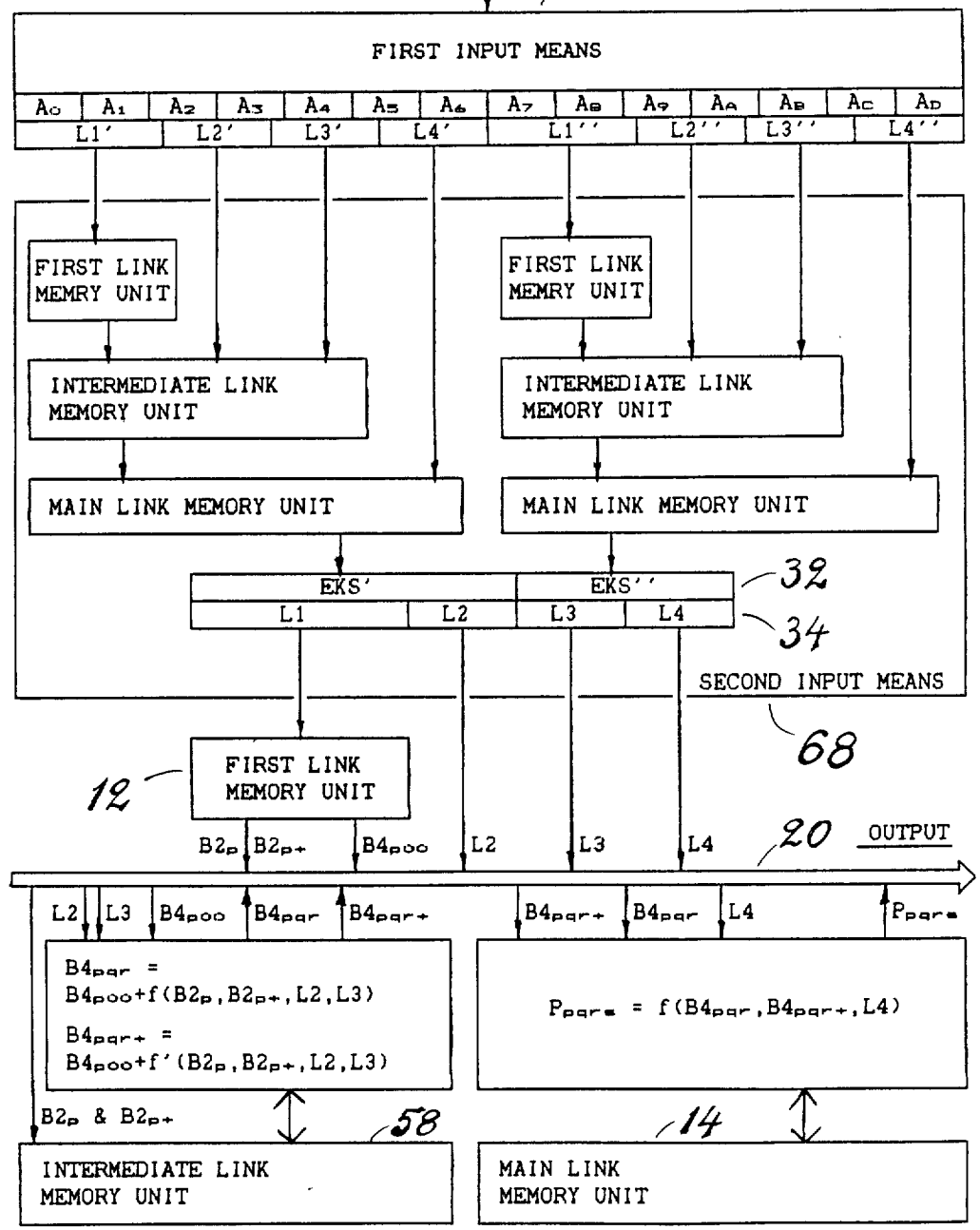

FIG. 6E shows an embodiment coping with input sequences comprising up to fourteen symbols. Code conversion is employed in two steps.

Figure 7A:
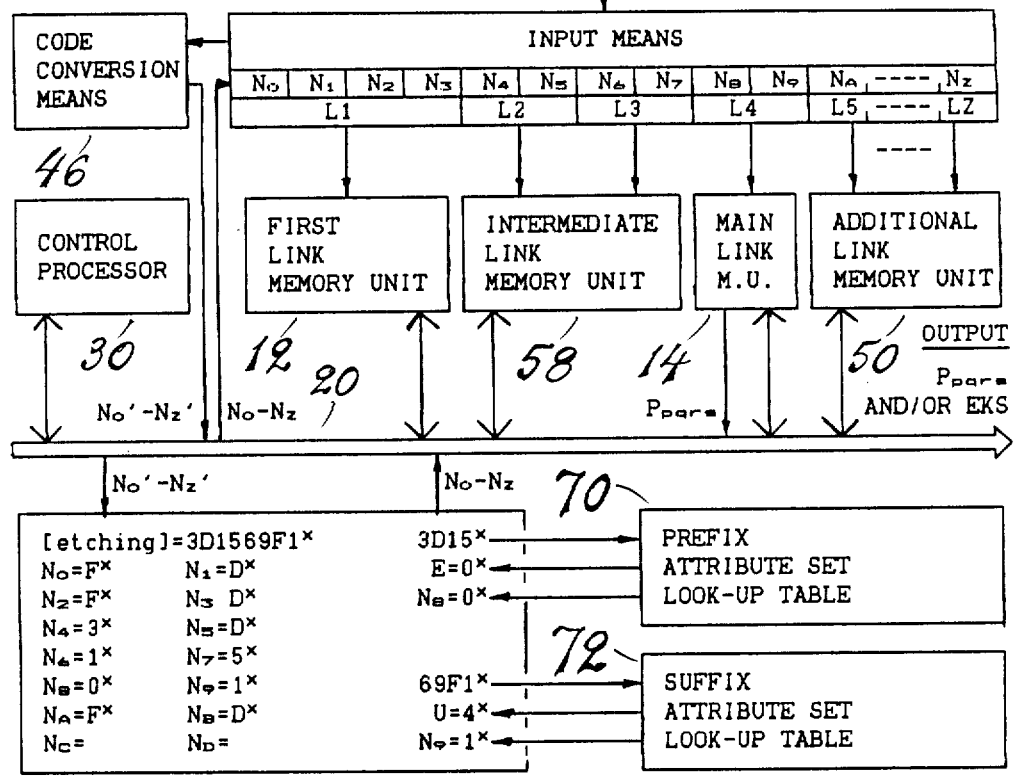
Figure 7B:
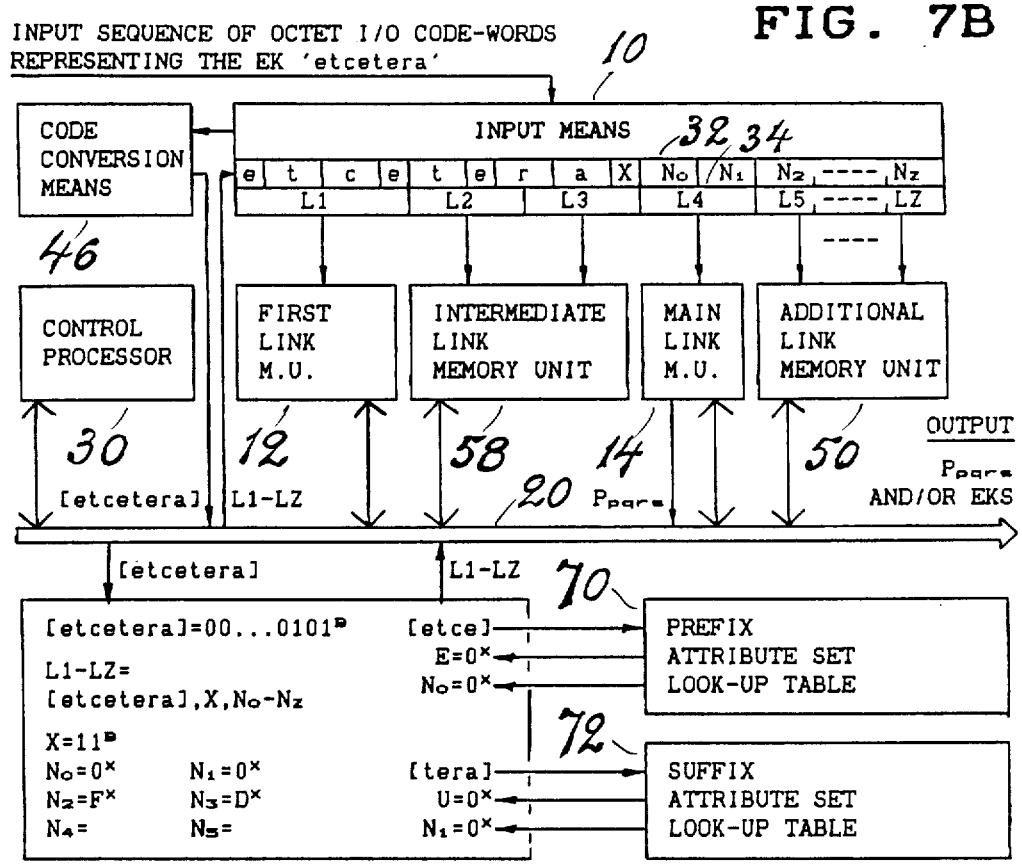

FIGS. 7A-7B relate to EK system embodiments with input means employing code conversion to 4-bit nibble code-words and variable length code-words, respectively.

Figure 8A:
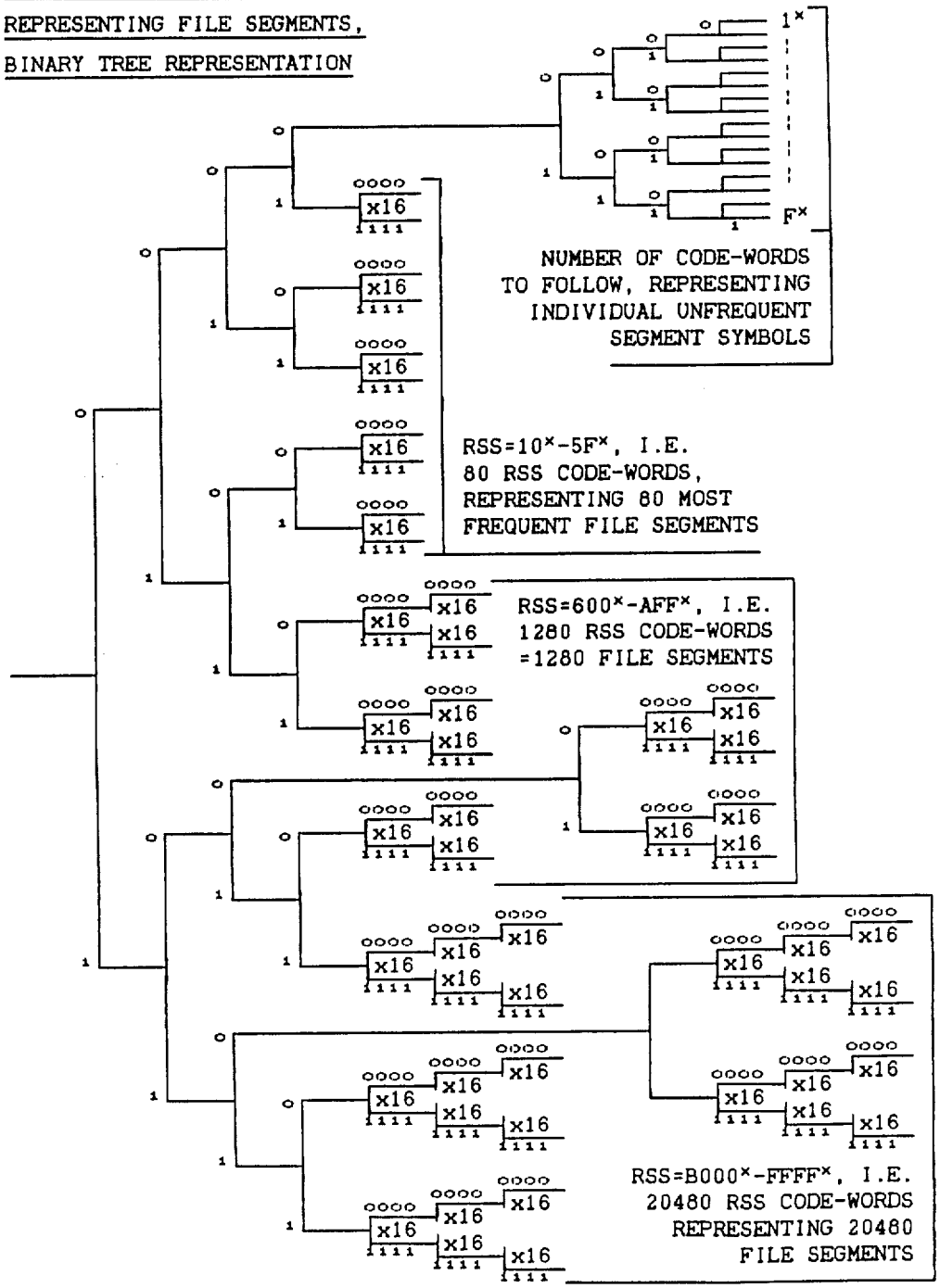

FIG. 8A relates to a file handling system embodiment employing variable length code-words.

DETAILED DESCRIPTION OF PREFERRED EMBODIMENTS

I—DEFINITION TABLE, GENERAL TERMS

SYSTEM: A group of interacting arrangements that may include implements of one or several means as suggested in the present Patent Application
USER: A person using the SYSTEM
ATTRIBUTE: An inherent characteristic
ELEMENT: A distinct irreducible something
ENTITY: A distinct something possessing unique qualities because of its ATTRIBUTES
SET: A number of different 'somethings' that belong together
MEMBER: A distinct somthing that belongs to a SET
ORDERED SET: A SET having all its MEMBERS arranged in a distinct sequential order
ITEM: A MEMBER of an ORDERED SET
ORDINAL: An ITEM sequence number
BIT OF INFORMATION: A unit of information equivalent to the result of a choice between two equally probable alternatives

II—DEFINITION TABLE, USER SYMBOLIC TERMS (REFERRING TO OBJECTS AS SEEN BY A USER)

SYMBOL: A visual symbolic representation of something

SYMBOL CODE: A SET of GRAPHIC and/or CONTROL CODE SYMBOLS designed for the purpose of graphic recording of data. This definition does not necessarily imply the existence of a corresponding set of code-words for machine communication CODE SYMBOL: A MEMBER of a SYMBOL CODE LETTER: Anyone of several GRAPHIC CODE SYMBOLS that combine to form GRAPHIC WORDS, such as textual and lexical words NUMERAL: Anyone of several GRAPHIC CODE SYMBOLS that combine to form NUMBERS BINARY NUMERAL: Anyone of the two NUMERALS 0 and 1 that combine to form binary numbers DECIMAL NUMERAL: Anyone of the ten NUMERALS 0, 1, 2, 3, 4, 5, 6, 7, 8 and 9 that combine to form decimal numbers HEXADECIMAL NUMERAL: Anyone of the sixteen NUMERALS 0, 1, 2, 3, 4, 5, 6, 7, 8, 9, A, B, C, D, E and F that combine to form HEXADECIMAL NUMBERS, unless otherwise pointed out a hexadecimal indicator is appended, e.g. F*, FF*

ALPHADECIMAL NUMERAL: Anyone of the thirty-two NUMERALS 0, 1, 2, 3, 4, 5, 6, 7, 8, 9, A, B, C, D, E, F, G, H, I, J, K, L, M, N, P, Q, R, S, T, U, V and W that combine to form ALPHADECIMAL NUMBERS, unless otherwise pointed out an alphadecimal indicator is appended, e.g. $W^\alpha$, $WW^\alpha$ SIGN: Any other GRAPHIC CODE SYMBOL used with LETTERS and/or NUMERALS for the purpose of graphic data recording, e.g. a punctuation mark CONTROL CODE SYMBOL: A CODE SYMBOL representing a control function e.g. an instruction to a printer to execute line feed, new page etc.

SP or SPACE: A CONTROL CODE SYMBOL representing the control function of generating a separation between recorded CODE SYMBOLS NUL or NULL: A CONTROL CODE SYMBOL representing a nullity RECORD: A graphic recording of data based upon a pertinent SYMBOL CODE SEGMENT: A sequence of CODE SYMBOLS constituting a RECORD of a small text segment, a data program segment or a data aggregate segment Ex.: A textual word or phrase of a running text FILE: A series of SEGMENTS related to each other and ordered in a distinct sequence TEXT FILE: A FILE containing SEGMENTS forming a running text PROGRAM FILE: A FILE containing SEGMENTS forming a data program DATA FILE: A FILE containing SEGMENTS forming a data aggregate FREQUENT SEGMENT: A SEGMENT occurring frequently within a particular class of FILES INFREQUENT SEGMENT: A SEGMENT occurring infrequently within a particular class of FILES REFERENCE SEGMENT: A FREQUENT SEGMENT selected as a reference RSS*: A REFERENCE SEGMENT SEQUENCE-NUMBER within a SET of REFERENCE SEGMENTS ENTITY RECORD*: A RECORD about an ENTITY ENTITY RECORD SET: A SET of ENTITY RECORDS EK (ENTITY KEY)*: An identifier of a concrete ENTITY RECORD within a SET of ENTITY RECORDS, the ENTITY KEY being identical to such ENTITY RECORD or being a part of a larger such ENTITY RECORD that also contains FURTHER DATA EKS*: An ENTITY KEY SEQUENCE-NUMBER within a SET of ENTITY KEYS EK ATTRIBUTE: An ATTRIBUTE distinguishing one or several members of a SET of ENTITY KEYS EK ATTRIBUTE SET: A selected SET of EK ATTRIBUTES, e.g. a SET of textual word suffixes I/O: Input to and/or Output from the SYSTEM I/O CODE*: A system of relations between I/O CODE SYMBOLS and I/O CODE-WORDS, facilitating a USER/SYSTEM interface I/O CODE-WORD*: A distinct SYSTEM representation of a corresponding I/O CODE SYMBOL I/O CODE-WORD VALUE*: A distinct numerical quantity being independent of which concrete physical means that are used for data interchange across the USER/SYSTEM interface, the I/O CODE-WORD VALUE being denoted by symbol and name using e.g. binary, decimal or hexadecimal notation. Ex.: Using as I/O CODE the American Standard Code for Information Interchange, the I/O CODE SYMBOL '4', representing the DECIMAL NUMERAL named 'Four', would correspond to an I/O CODE-WORD with a binary VALUE of '00110100', equivalent to a decimal VALUE of '52' named 'Fifty-two' and equivalent to a hexadecimal VALUE '$34^x$' named 'Thirty-four' Hex'

III—DEFINITION TABLE, SYSTEM IMPLEMENTATION TERMS

STORE (a verb): To PUT IN STORE—not used in the context of HOLD IN STORE—which implies that the words PREVIOUSLY STORED VALUE means a VALUE that is still being held in store. Moreover, the term STORE and the term PUT IN STORE, as used in the present patent application, do not exclude the context of storing data within read only memory devices as part of a mass production process ENTITY DATA SET: A representation of an ENTITY RECORD SET that is being held within a SYSTEM EX SYSTEM (ENTITY KEY SYSTEM): A SYSTEM for holding a SET of ENTITY KEYS in store, facilitating retrieval of related ENTITY RECORDS by a USER and/or retrieval of related ENTITY KEY representations for internal use within the SYSTEM COMPRESSED FILE: A compact FILE representation being held in store or being transferred between separate locations FILE HANDLING SYSTEM: A SYSTEM for holding and transferring FILE repesentations, e.g. for holding and transferring COMPRESSED FILES DIGIT: A SYSTEM implementation of a NUMERAL, the numerical VALUE of which is being held within the SYSTEM, either in a permanent read only memory or in an erasable read/write memory BIT: A BINARY DIGIT, i.e. a DIGIT from a number system based on two ELEMENTS, 0 and 1, the BINARY DIGIT requiring a two-state memory cell for storage BIT OF STORAGE: A unit of storage capacity representing a capacity of one BINARY DIGIT BYTE (OF STORAGE): A unit of storage capacity representing a capacity of eight BINARY DIGITS BYTE LOCATION: A physical storage device having a storage capacity of one BYTE TERNARY DIGIT: A DIGIT of base three, requiring a three-state memory cell for storage NIBBLE: A DIGIT of base 16, requiring four BITS OF STORAGE ALPHIT: An ALPHADECIMAL DIGIT, i.e. a DIGIT of base 32, requiring five BITS OF STORAGE, the name ALPHIT was chosen because a set of 32 ALPHITS is enough to represent a complete set of lower or upper case LETTERS of most alphabets currently in use OCTET: A DIGIT of base 256, requiring one BYTE OF STORAGE DIGITAL WORD: A sequence of DIGITS being held within a functionally contiguous string of memory cells or being transferred from one location to another, whenever being referred to or shown in symbolic form the leftmost DIGIT position of the sequence or string is supposed to hold the most significant DIGIT LINKED DIGITAL WORD (CONCATENATED WORD): Two or more separate DIGITAL WORDS having been functionally combined into one contiguous sequence VALUE: A distinct numerical quantity uniquely representing a DIGITAL WORD, the term VALUE being used to denote anything that is being held within a string of memory cells or being transferred from one location to another, such VALUE being denoted by symbol and name using e.g. binary, decimal, hexadecimal or alphadecimal notation OVERALL VALUE: The VALUE of a LINKED DIGITAL WORD CODE-WORD: A DIGITAL WORD representing a MEMBER of a CODE SET CODE-WORD SET: A set of fixed length or variable length CODE-WORDS representing a CODE SET ORDINAL CODE-WORD: A representation of a sequence-number within an ordered set CODE-WORD VALUE: A VALUE denoting a CODE-WORD COMPACT CODE: An internal system code facilitating conversion between one CODE-WORD SET and another more compact CODE-WORD SET COMPACT CODE-WORD: A DIGITAL WORD representing a MEMBER of a COMPACT CODE SET LINK: A storage device in a chain of functionally linked storage devices LINK VALUE: A VALUE denoting the content of a LINK ADDRESS WORD: A DIGITAL WORD representing an absolute or a relative ADDRESS ADDRESS VALUE: A VALUE quantifying an absolute or a relative ADDRESS ADDRESS COMPONENT: A DIGITAL WORD used in combination with other ADDRESS COMPONENTS for assembling an ADDRESS WORD ADDRESS COMPONENT VALUE: A VALUE denoting an ADDRESS COMPONENT, i.e. a VALUE used in combination with other ADDRESS COMPONENT VALUES for computing an ADDRESS VALUE TABLE: A read/write or a read only memory area functionally arranged in rows of one or more columns for storing VALUES BOUNDARY ADDRESS TABLE (FIRST LINK MEMORY UNIT): A TABLE generating as an output one or several BOUNDARY ADDRESSES in response to an input of a FIRST LINK VALUE, the TABLE also generating, if required, in response to input of a BOUNDARY ADDRESS, an output of a relevant FIRST LINK VALUE as well as other BOUNDARY ADDRESSES related to such FIRST LINK VALUE, if any REDUNDANCY: Unused capacity of a storage location or of a set of CODE-WORDS, i.e. the number of possible VALUES not being used REDUNDANCY RATIO: The ratio of the number of VALUES not being used to the number of VALUES being used. Ex.: A BYTE OF STORAGE used to hold nothing but one NIBBLE. If each one of sixteen possible NIBBLE VALUES are being used, the redundancy ratio is $(256-16)/16=15$.

*Also used as an equivalent SYSTEM implementation term
**Also used as a term to denote a symbolic equivalent for the purpose of describing the SYSTEM implementation With reference to FIGS. 1A through 7B, the functioning of preferred embodiments of an EK system according to the invention will be explained by following in detail how responses to various inputs are provided. Specific EKs are assumed to have been input and put in store beforehand as part of a large set of EKs. Such inputs may have been previously stored within read only memory devices as part of a mass production process or they may have been stored by inputting EKs into a working system. In the latter case the embodiment uses read/write type of memory devices and can be set in a mode for storing previously not stored EKs. Erasing stored EKs is an obvious reciprocal process, not further mentioned in the present patent application.

As in most of the figures, FIG. 1A shows several strings of boxes, each one representing a string of storage locations. Such strings are drawn, either horizontally as within input means 10, or vertically as within memory units 12 & 14, always in an order of increasing address values from left to right or from top to bottom. Vertical strings 16 & 18 are placed underneath a horizontally drawn system bus 20 and an address value determining the location of a particular box is indicated by the length of a vertical line 22, drawn between bus 20 and the top 24 of the box. Such a vertical line is pointing downwards if the box is being addressed and upwards to indicate that the address of the box location is being registered. A value being read from a box is shown as a line 26 coming out of the box and pointing at the bus. A search for a particular value being held within a string is illustrated by a vertical line 28, designated with the search argument value L2. Line 28 is related to a series of boxes within a particular searching range, each such box being marked along the left hand side of the string. Each executed test is marked by an ordinal, 0 denoting the box first being tested for a match between the search argument L2 and the value $L2_{10}$ held in store within the box. A star '*' is used to mark a box that need not be examined because a match has already been found. A match at test number 2 is indicated by a short horizontal line crossing the left hand side of the box holding the matching value $L2_{12}$. In reality $L2_{pq}$ values are being read out of the numbered boxes one by one and transferred along line 28 for comparison with value L2 within control processor block 30.

A system of indexing is used in this specification to designate, in an orderly manner, address values, data values as well as tables holding such values. Mainly four index variables are used, p, q, r and s. The q, r and s indices are only used in their respective positions within the combinations pqrs, pqr and pq. Index variables may be exchanged for actual values using alphadecimal numerals. To avoid more than one numeral in an index position, values greater than W may be designated Z, in particular to indicate a last item within a set. All four indices are ordinal indices, each one having values within a series 0, 1, 2 ... Z.

Index p is the item sequence number within the set of $L1_p$ values related to the EK set representation being held in store. No $L1_p$ values are held in store as such, however, each $L1_p$ value is represented as a relative address of a storage location within string 16, each such location holding a related boundary address value $B2_p$. The series of values from $B2_0$ to $B2_{z+}$ determines the size of each particular table $T2_p$. The $B2_p$ values have been assigned in ascending value order with increasing p values, with adequate steps to make each $T2_p$ table just large enough to hold all those individual main link $L2_{pq}$ values that have previously been presented for storage concurrently with a valid $L1_p$ value.

Index q is an item sequence number for each particular value of p, thus designating $L2_{pq}$ values individually within each table $T2_p$. All $L2_{pq}$ values are held in one functionally consecutive string 18, within each table $T2_p$ in value ascending order with increasing address values. The series of composite pq numbers are thus forming a number series in ascending pq value order with ascending address values. Valve $L2_{00}$ is held at the lowest address $B2_0$ and value $L2_{z7}$ at the highest address $B2_{z+} - 1$. The $B2_{z+}$ value is used to determine the end of the last table $T2_z$. A plus or minus sign completing an index number designates the next higher or lower number in the index number series. For example, if $L2_{p7}$ is held in store at the highest address within table $T2_p$ and the value of p is 1, then index p7+ is equivalent to pq=20.

The storage capacity of a box is shown by the width, i.e., 1/10 of an inch for each bit of storage capacity. Byte boxes are thus 8/10 of an inch wide. Broken frames are used to indicate that the storage capacity may be higher than the width shown.

FIGS. 1A–1F illustrate different basic features of system embodiments using unsophisticated input means and only two linked digital words for interfacing input means with memory means. Except for the reversed process shown in FIG. 1C, input means are shown at the top of the figures in the form of a block 10 including two short strings of storage locations, 32 & 34, string 32 for temporarily holding a representation of a current I/O code-word input and a string 34 for temporarily holding two linked digital words.

String 32 provides storage for octet values $O_0$, $O_1$ $O_2$, values directly obtained from three eight bit I/O code-words representing a three symbol EK input sequence.

The values of the octets are directly transferred to the two linked digital words residing in the 16 plus 8 bit string 34. The 16 bit word attains the value $L1=O_0*256+O_1$ and the 8 bit word the value $L2=O_2$. Assume that the I/O code used for input is the American Standard Code for Information Interchange, ASCII, and that previously stored EKs comprise all 512 possible three letter combinations of the first eight lower case letters of the English alphabet.

The link value L1 is used by the control processor 30 for producing address values to access the first link memory unit 12, wherefrom boundary address values $B2_p$ are being read out. The link value L2 is used for comparison with values held in store within the main link memory unit 14, within an address range determined by boundary address value pairs, $B2_p$ & $B2_{p+}$.

The control processor 30 is communicating with all other parts of the system via the system bus 20. Processor 30 executes a control program for each input sequence and governs output of a response via bus 20, whereupon input means 10 are being reset, making them ready to receive a new input sequence.

With the assumptions made there are $8^3=512$ different EKs held in store, the storage of which has generated $8^2=64$ different boundary address values $B2_0-B2_z$, where $Z=63$. These 64 values are the addresses of the first storage location 36 of 64 distinct tables $T2_0-T2_z$, where $Z=63$. Each such table is holding 8 values $L2_{p0}-L2_{p7}$, where p ranged from 0 to 63, a total of 512 $L2_{pq}$ values representing 512 stored EKs.

FIG. 1A represents a case where the EK input sequence is 'abc'. The decimal ASCII values representing the symbols 'abc' are 97,98 and 99, respectively. The symbols 'ab' are represented by a value $L1=97*256+98=24930$. There is only one symbol pair, 'aa', that has generated a lower L1 value, hence index p assumes the value 0 for the pair 'aa' and the value 1 for the pair 'ab'. There are eight $L2_{pq}$ values held in store in table $T2_1$, i.e. 97 through 104 in decimal notation, the third one, decimal 99 matching the current main link value L2. As shown in the figure a match was obtained as a result of a search starting at the first storage location marked 0 within table $T2_i$, a location pointed at by a boundary address value $B2_1$, obtained from a two-byte storage location within table T1, at an offset address governed by the current L1 value 24930. Said match was obtained in the eleventh byte storage location, counted from the lowest address $B2_0$, and an EKS value of 10 is therefore output. The EKS value is an item sequence number within a series 0, 1, 2 ... 511, numbers that uniquely represent the complement of 512 EKs having been input.

Within table T1 are also shown $B2_p$ values related to a group of $L1_p$ values from 25185 through 25188, $L1_8-L1_B$ values that correspond to symbol pairs 'ba,bb,bc,bd'. Also shown is the highest $L1_p$ value 26728, corresponding to the symbol pair 'hh', and the last two $B2_{z+}$ locations related to a not stored EK that would have generated an $L1_p$ value of 65535. All T1 locations relating to not stored EKs are holding the same $B2_p$ value as the one stored within a preceding T1 location. Index n is used in lieu of index p to emphasize that the value is not related to a valid EK. The designation $L1_p$ will be used later on as representing any possible L1 value, including invalid ones. Apparently table T1 contains a lot of redundant information when used as in this example. When holding only 512 EKs in store, 257 bytes of storage are required for each EK, provided a full length T1 table is used, having 65537 two byte rows. On the other hand, with such an embodiment very few computer instructions are required to obtain a response from the system.

The particular embodiment being described has a capacity to store all possible three-symbol combinations employing a 256 symbol code, i.e. the maximum possible in case of an octet code-word representation. The storing capacity would be $256^3 = 16.8$ million different EKs, requiring a three byte wide T1 table in lieu of the two byte wide table shown in FIG. 1A. Nevertheless, the amount of storage required by table T1 would be significant. In total 1.01 byte of storage would be required for each EK. On the other hand, the response time would increase as the search range within each $T2_p$ table would amount to 256 byte of storage. However, the response time could still be kept extremely short by searching such range using conventional binary search methods. A relevant notion is also that minimal response time requires all tables to be stored in fast access type of electronic memories, a requirement more easily met if a high degree of compression has been achieved.

FIG. 1B shows how a previously not stored EK is being stored. This figure represents the same embodiment as in FIG. 1A, but with the number of stored EKs having been reduced from 512 to 511. However, tables 16 & 18 will contain the same values as in FIG. 1A after storage of the EK sequence 'abb'.

Input of octet values representing 'abb', i.e. 97, 98 and 98, is generating a current L1 value of 24930. This value causes boundary addresses $B2_1$ and $B2_2$ to be read out of table T1. Processor 30 checks that $B2_2$ is greater than $B2_1$ and initiates a search for the current L2 value 98 within the $T2_1$ table, specified by said boundary addresses. Value $L2_{10} = 97$ is read out of the first storage location 36 and found to be less than the current value $L2 = 98$. Next value $L2_{11} = 99$ is found to be higher than 98 and the search is halted as all remaining $L2_{pq}$ values are even higher, having been stored in ascending value order. An EK reject signal 40 is output via bus 20 and the system user may command control processor 30, if not already done, to react upon such reject signal 40 executing an insert instruction sequence. Such sequence includes (i) moving to the next higher address each previously stored $L2_{pq}$ value having a pq index higher than 10, (ii) inserting the current L2 value within the storage location of the previously stored value $L2_{11}$ and (iii) increasing all $B2_p$ values by one unit for all p values greater than 1.

In case no EKs having 'ab' as their first two symbols had been previously stored, processor 30 would have found $B2_2$ to be equal to $B2_1$. No $T2_1$ table would exist and an EK reject signal 40 would be output based upon first link criteria. In such case the insert instruction sequence would include (i) moving to the next higher address each previously stored $L2_{pq}$ value having an address equal to $B2_1$ and higher, (ii) inserting the current L2 value within the storage location at address $B2_1$ and (iii) increasing all $B2_p$ values by one unit for all p values greater than 1.

To avoid a time consuming move of large number of values spare storage locations may be arranged at convenient intervals.

FIG. 1C illustrates the reversed process of outputting an EK I/O code-word representation in response to an input of an EKS, i.e. a particular EK sequence number. Processor 30 adds the current input EKS value 10, received via system bus 20, to the boundary address value $B2_0$ and reads out from string 18 at the resulting address $B2_0 + 10$ a current main link value $L2 = 99$. In order to determine also the first link value L1 the T1 table 16 is searched for the highest $B2_p$ value that is equal to or lower than such resulting address. A binary search is employed in order to reduce the number of tests required to find such $B2_p$ value. After ten binary search tests, numbered 0 to 9 in the figure, a sequential search is started at $B1_0 + 24928$, because at this point the target location is closed and must be found at an address lower than the one tested as number 8. At three sequential tests, A, B & C, values lower than $B2_0 + 10$ are read out of table T1 and at number D $B2_0 + 16$ is found to be higher, a value that is found at address $B1_0 + L1 + 1$. Processor 30 is now able to determine the current first link value $L1 = 24930$ by subtracting $B1_0 + 1$ from the address found.

Finally output means 42 transforms the current link values into a sequence of three I/O code-words. The first octet value $O_o$ is computed as the integer part of $24930/256 = 97$. The second octet value $O_1$ is computed as $24930 - O_o * 256 = 98$ and the third value $O_2$ is equal to the current main link value 99. These three values represent the symbol sequence 'abc'.

FIGS. 1D–1F relate to EK systems having means for outputting pointer addresses in response to EK I/O code-word inputs. The embodiment shown in FIG. 1D is operating in an EK matching mode and the one shown in FIGS. 1E & 1F in an EK non-matching mode. The term EK matching mode is used to emphasize the fact that any output from the system, such as pointer address output and EKS output, relates to an EK input that is matching a previously stored EK. The term EK non-matching mode is used to emphasize the fact that system output relates to any EK input generating overall link values also falling between overall link values representing previously stored EKs. This latter mode is therefore in the following being referred to as a gateway mode of operation.

The embodiments shown in FIGS. 1D–1F are similar to the one in FIG. 1A, except that a second column 44 holding pointer addresses $P_{pq}$ has been added to each $T2_p$ table, each such $P_{pq}$ address value being related to a particular first column $L2_{pq}$ value. In the gateway mode, however, each $P_{pq}$ value is also related to any EK that, if being input, would generate L2 values falling between such $L2_{pq}$ value and its closest neighbor $L2_{pq+}$.

Any data associated with the EK may be transferred to and/or output from an external device, the location within such a device being found by use of the pointer value $P_{pq}$. Such data are supposed to be strictly related to specific EKs in the matching mode of operation, in gateway mode the system will relate EK groups to common external device addresses.

It is also worth mentioning that at storage of previously not stored EKs, a new row is inserted within a relevant $T2_p$ table and $L2_{pq}/P_{pq}$ value pairs being held in rows at higher addresses have to be moved. A firm relationship between each main link value $L2_{pq}$ and its related pointer address value $P_{pq}$ is thus maintained. However, memory space limitations may dictate that such second column 44 of table $T2_p$ is placed within a low cost external storage device, in which case the EKS code-word may be used as a pointer into such an external table.

For convenience a different method to present codeword values has been introduced in FIGS. 1D–1F.

Whenever input symbols appear inside a box or within brackets they should be interpreted as denoting the corresponding code-word value.

FIG. 1D illustrates how a pointer value $P_{12}$ is found within column 44 of Table $T2_1$ and read out for output via system bus 20. Manipulation of data associated with the EK 'abc' is facilitated using the pointer value for addressing.

FIG. 1E illustrates an embodiment identical with the one shown in FIG. 1D except that a pointer output response is facilitated also for an EK input sequence that has not been previously stored. Therefore this embodiment is operating in the gateway mode. The sequence 'aai' is used as input and generates a first link value that has been generated by previously stored input sequences, therefore, the gateway mode of operation does not impact the functioning of the first link memory unit in this case. Upon a no match search in table $T2_0$, the current L2 value [i] is associated with a particular $L2_{oq}$ value, being the highest possible but not higher than the value L2 itself. The figure uses the '>' sign to indicate that such condition is met at $L2_{07}$ and a double headed arrow is indicating that a related pointer address $P_{07}$ is thereby found. Also L2 values searching table $T2_1$, being lower than $L2_{80}$, are being related to $P_{07}$.

FIG. 1F illustrates an embodiment identical to the one shown in FIG. 1E except that the symbol sequence 'aia' is used as input. This sequence generates a first link value that has not been generated by any previously stored input sequences. A comparison being made between $B2_n$ for L1 and for L1+1 shows no difference as value $B2_8$ is being read out from string 16 for L1=24937 as well as for L1=24938. With the system operating in the gateway mode the control processor will then read out the pointer value $P_{77}$ directly via system bus 20 from the second column 44 of $T2_p$ tables at an address $B2_8-1$. The same would happen for any L1 value from 24937 through 25184. The next value, L1=25185, is a value generated by previously stored symbol sequences, i.e. those beginning with the pair 'ba'. In the figure a double headed arrow indicates the location of the pointer address $P_{77}$. A box with a pointer address $P_{00-}$ has been added to cover L1 values below 24929.

The embodiments described so far are capable of storing only three-symbol EKs, which is a severe restriction in most applications. Conversion to compact codes facilitates accommodation of an increased number of code-words within string 32, whereby an increased number of input symbols per EK is allowed. A compact code representation has the additional advantage of reducing memory space requirements, which provides shorter response times as more EK representations may be simultaneously held within a given working memory area. The compact representation leads to shorter response times also because fewer bits will become involved at each retrieval attempt. Furthermore, the use of compact codes may facilitate a shortening of string 32, which reduces first link memory requirements. A shortening by just one bit will cut in half the length of boundary address table 16.

FIGS. 2A-2C illustrate three different coding schemes for code conversion from standard I/O codes to compact codes, to be applied within input means 10. FIG. 2A shows conversion to five-bit alphit code-words, FIG. 2B to four-bit nibble code-words and FIG. 2C to variable length code-words. These coding schemes are also applicable for retransforming compact code-word sequences into standard I/O code-word outputs.

The alphit code of FIG. 2A is suitable for adaptation to sophisticated sorting order requirements. In FIGS. 3A through 6E such code is used, illustrating various features, including sorting order features.

Nibble codes as well as codes using variable length code-words are unusable in applications having specific sorting requirements. However, such codes have other qualities that make them suitable where sorting order is of no concern. In FIGS. 7A and 7B such codes are used, emphasizing the importance of a high degree of compaction.

The functioning of a system embodiment including compact code conversion is basically the same as explained with reference to FIGS. 1A through 1F, once the link values are determined. The particular features illustrated in those figures are therefore applicable also to embodiments using compact codes.

FIG. 3A shows an embodiment with an input sequence of four octet I/O code-words representing the EK 'etch'. Code conversion is employed, compacting the 32 bit input to a 20 bit compact code representation based on a 5-bit alphit code-words. Code conversion means 46 are shown in the form of a look-up table 48, comprising a string of 256 alphit code-words having its first alphit location at address $B0_0$. Alphit values $A_n$ are read out from table 48 in sequence from n=0 to n=3 at addresses $B0_0+O_n$. The table below explains how the contents of the small string 32, wherein the succession of alphit values is temporarily held, is being transferred to string 34, temporarily holding the two linked digital words, here represented by their link values L1 and L2. Alphit values representing the code symbols are taken from the encoding scheme of FIG. 2A, shown in the table in alphadecimal notation as well as in the corresponding binary notation. The bit representation is shown as one contiguous succession placed within the middle row of the table. Link values are shown in hexadecimal notation.

| e | t | c | h |
|---|---|---|---|
| $9^\alpha$ | $P^\alpha$ | $7^\alpha$ | $C^\alpha$ |
| 0 1 0 0 1 | 1 1 0 0 0 | 0 0 1 1 1 | 0 1 1 0 0 |
| $4^x$ . $E^x$ . $0^x$ | | $E^x$ . $C^x$ | |
| L1 = $4E0^x$ | | L2 = $EC^x$ | |

← code symbols
← alphit values
← bit succession
← hexadecimal numerals
← hexadecimal numbers ←more — significance of bit position — less→

The first link memory unit is block 12 in FIG. 3A. The T1 table inside comprises only 4097 rows in this case, as compared to 65537 rows in the embodiments of FIGS. 1A through 1F. Control processor 30 reads $B2_p$ boundary address values out of the T1 table from storage locations determined from the link value L1. For L1=$4E0^x$ $B2_5$ and $B2_6$ are read out, determining the search range within string 18 wherein eleven EKs are shown as previously stored. Respective $L2_{pq}$ values are shown in hexadecimal notation. EKs comprising less than four symbols have been allocated $L2_{pq}$ values under the assumption that each input sequence of octet I/O code-words has been filled up by adding code-words representing a nullity, i.e. NUL with an alphit value of 2. The main link value $EC^{xx}$, representing EK 'etch', is read out as the last item at the end of the searching range and found to match the current L2 value. As can be seen from the figure, those eleven previously stored EKs would be presented in proper sorting order if being output sequentially in EKS number order, using the technique of FIG. 1C. The long word 'etcetera' would be output as 'etce'.

FIG. 3B illustrates how an input of the previously not stored EK 'et cetera' would result in insertion of the current main link value $L2=67^x$ at an improper place, considering a desirable sorting order. A solution to this problem will be presented later with reference to FIG. 4B. For an explanation of the functioning at an insertion, reference is made to previous comments to FIG. 1B.

FIG. 3C shows an embodiment based on bit map memory means 52. It is presumed that the same eleven EKs as shown in FIG. 3A have been previously stored, one of them, i.e. 'etcetera', being used for current input. Input means 10, including code conversion means 46, are identical to corresponding means shown in FIG. 3A except for the small string 34 that has been increased in length. Section values, S1 through S8, are produced exactly as are link values. The new term section is introduced in lieu of the corresponding term link to facilitate description of EK systems wherein the same small string may hold section values as well as link values, section values being related to bit map memory means and link values to ordinary memory means. An example of such combined use will be discussed in relation to FIG. 6D.

The embodiment shown in FIG. 3C has one section for one alphit, thereby making section values identical to alphit values, which facilitates use of a common set of storage locations. A maximum of eight such values are accommodated for each EK, requiring a set of eight bit maps, i.e. tables T1 through T8. The sequences representing the eleven EKs vary in length from one to eight alphit values, however, in order to facilitate output of an EKs in response to an EK I/O code-word input, the code conversion means 46 adds to each such sequence an appropriate number of control function alphits to make them all eight alphits long. In order to achieve a proper sorting order such alphits has to be added after the alphits representing the EK symbols. However, the embodiment shown in FIG. 3C illustrates a memory saving alternative, which is preferable in applications not demanding a proper sorting order. The control function alphits are added up front, whereby such alphits are represented only once within the bit maps. For example, the five symbols a,b,c,d and e are all represented within each one of tables T1 through T7 by just one bit marked as being in the 1 state. These marked bits are located at a relative bit address $02^\alpha$ within each table, i.e. the third bit position counted from right to left within the first row of each table. This bit address value corresponds to the alphit value $2^\alpha$ used to represent the system control function.

Within table T8 a first group of 32 bit locations, at relative bit addresses $00^\alpha$–$0W^\alpha$, is reserved to represent previously stored S1 values related to such previously stored section values S1 through S7 that are represented by the lowest address bit mark within respective tables. Therefore, in FIG. 3C the first 32-bit group within table T8 is reserved to represent single letter symbol inputs. The five marked bits within this group represent the stored symbols 'a,b,c,d,e', e.g. the leftmost bit position within the first row, at relative bit address $07^\alpha$, represents the symbol having a code-word value of $7^\alpha$. This value represents the symbol 'c', as can be seen from the code table in FIG. 2A. It is interesting to note that any previously not stored single symbol EK may be included as having been stored, just by marking the particular bit position within table T8 at a relative bit address equal to the symbol code-word value.

The current EK input 'etcetera' generates eight alphit values that are placed within the small string 32, whereby current section values S1 through S8 are determined. These values are used to produce current relative bit location addresses within respective tables T1–T8. According to FIG. 3C each bit map table comprises a string of byte storage locations, the relative address of the least significant bit within each byte being indicated along the right hand side of each table using alphadecimal notation. The address of any other bit location is determined from the figure by adding 0–7 when counting from right to left. The values used for this purpose in the embodiment being described are designated $S1_L$–$S8_L$, obtained by stripping off the three least significant bits from each of the values S1–S8. As can be seen from FIG. 2A the S1 value $9^\alpha$ equals 01001 in binary notation and $S1_L$ thus attains the value 001.

For table T1 the current relative byte address actually used for addressing is computed as $S1/8=01$. Shown in the figure is the corresponding relative bit address $S1_B=S1-S1_L=08^\alpha$. The control processor reads the value $M1_{08}$ out of this byte location and produces a bit mark match as value $S1_L=1$ is found to point at a bit position which as a bit value 1. Such match means that an S1 value equal to the current S1 value has been previously stored.

For each of the succeeding tables, T2–T8, the current relative byte address is computed as $S2/8+M1*4$, $S3/8+M2*4$ ... $S8/8+M7*4$, where values M1 through M7 are produced, within each table T1–T7, as a count of the number of marked bits at bit location addresses lower than the current one. A corresponding M8 value equates the current EKs value used as output.

In order to facilitate a fast count of marked bits a mark-count table 54, also named TM table, is employed as shown in FIG. 3C. This table is a 4-bit wide look-up table using as a relative entry address the overall value of a group of eight bits, i.e. a byte value. The number of marked bits within the byte is read out of table 54 in one fast operation. On the right hand side of table 54 entry relative address value $V_{ij}$ are shown in hexadecimal notation, $00^x$, $01^x$ ... $FF^x$.

In order to further speed up the counting process when many successive 8-bit groups have to be examined, an aggregate mark-count table 56 may be employed. Shown in FIG. 3C is such a table named table TM8, holding a series of aggregated mark-counts for groups of 32 bits. For example, the value $M8_5$ found at the relative byte storage address 5 represents the total count of marked bits within the first five 32-bit groups of table T8. This particular value, $M8_5=10$, is read out as a first step to determine the EKS value related to the current EK 'etcetera'.

The second and last step to determine the EKS value is to produce a mark-count within the sixth 32-bit group of table T8, wherein a marked bit representing the last symbol 'a' has been found at address $55^\alpha$. This marked bit is located within the first byte of the 32-bit group, therefore it only remains to test if there are any marked bits within this byte at bit addresses below $55^\alpha$. The byte value $M8_{50}$ is read out and the three leftmost bit positions are masked and the remaining overall value which happens to become $00^x$ is fed to the TM table 54 as a $V_{80}$ entry value and $M_{80}=0$ is read out. The EKS value is determined as $EKS=M_{85}+M_{80}=10$.

As the current EKS value is produced as a count of the number of marked bits within the T8 table at bit position addresses lower than the current one, EKS value are generated in such order that all single symbol EKs will appear, when presented in EKS order, as being sorted in poper alphabetic order. All two symbol EKs will next appear in sorted order, thereafter all three symbol EKs and so on. This is because, within each table succeeding the first one, groups of 32 bits have been allocated to represent previously stored EKs in an order governed by the count of marked bits within the immediately preceding table at bit location addresses below the bit location related to such 32 bit group. The current input EK 'etcetera', being the longest one within the set of eleven EKs, will appear as no. 10 within the series of EKS numbers 0–10.

FIGS. 4A & 4B refer to a modified embodiment, having means of facilitating a proper sorting order as follows: E, e, ET, Et, et, ETA, Eta, eta, ETC, Etc, etc, ETC., Etc., etc., et cetera, ETCETERA, Etcetera, etcetera, ETCH, Etch, etch. The modified embodiment differs from the one referred to in FIGS. 3A & 3B by having an 8 bit wide TL0 look-up table 48 and a control program function that determines a Q value based on the values of the leftmost 3 bits shown in table 48. FIGS. 4A & 4B provides the algorithm 48 to be used in order to make the overall link value such that a proper sorting order is obtained. This is achieved by including such Q value at the end of string 32, ignoring any single space or hyphen code-word when creating the alphit value sequence to be temporarily held within string 32.

FIGS. 5A & 5B refers to an embodiment equivalent to the one shown in FIG. 3A, however, including also an additional link memory unit 50, for the purpose of fully and uniquely representing I/O code-word inputs of any length. Links L1 and L2 are mandatory links used for any input, L2 being the main link as in all above described embodiments. In FIG. 5A is shown the same set of eleven previously stored EKs as in FIG. 3A and the current EK input is 'etcetera'. In FIG. 5B the EK 'et cetera' has been added in order to illustrate how proper sorting order is achieved also when additional links are employed. The code conversion means append at the end of string 32 a terminator in form of a control code-word with an alphit value $1^\alpha$. In order to represent compounded EKs and EKs including capitals a two alphit sequence is used as a terminator, starting with the system control code-word $0^\alpha$.

An output in form of an EK match signal and/or an EKs value is generated if an overall link value matching condition has been produced. The EKS value is derived from the relative address of the main link storage location where the current main link value is found.

As an alternative, pointer address values may be output provided a second column holding such values is included within each main link table $T2_p$.

The additional link memory unit 50 shown in FIGS. 5A & 5B comprises in itself a series of small EK systems, here employed as sub-systems. The first such sub-system in the series uses the EKS code-word concatenated with the third link alphit as an input which is transformed into two digital words. The second one of those two digital words comprises the last three bits from the EKS code-word combined with the third link alphit.

The first digital word is added to a base address B3 and the resulting address is used to locate and read out a pair of boundary addresses from a boundary address table having its first row at address B3. This first sub-system produces as an output a sequence-number T3S. The next sub-system in the series uses the T3S code-word concatenated with the next link alphit as an input which is transformed into two new digital words. The functioning is iterated until there are no more link alphits left.

The overall link value matching condition is produced by examining alternative overall additional link values, should previously stored link values have generated such alternatives individually related to duplicated main link storage locations holding identical current main link values. This is the case illustrated in FIG. 5B, where the storage of the additional EK 'et cetera' has caused a $L2_{54}$ value to be stored within the main link memory unit, a value identical with the $L2_{55}$ value representing the EK 'etcetera'. By comparing the contents of string 32 in FIG. 5A and FIG. 5B it can be seen that the open compound 'et cetera' is stored exactly as the corresponding solid compound 'etcetera', except for the terminators that are designed to adjust the least significant part of the overall link value to facilitate a proper sorting order, also in case capital letters are represented by means of specially selected L8 values.

As shown in FIG. 5B the overall link value matching condition has been produced already upon examining the first alternative, i.e. number 4 in the sequential search of $L2_{5q}$ values. $EKS=9$ is derived from the relative address of the main link storage location related to this first matching alternative, i.e. the $L2_{54}$ location.

FIGS. 6A through 6E relate to embodiments including intermediate links. Code conversion to alphit code-words is employed.

FIG. 6A illustrates a basic concept applied in all the embodiments shown in FIGS. 6B through 6E. Following conventions are used for designating values, addresses, tables, etcetera:

p is an ordinal index (0, 1, 2, . . . ) designating all previously stored boundary address value pairs, B2 & B4, in ascending address value order. Each B2 and B4 value represents the address of the first row of a table, address $B2_p$ pointing at table $T2_p$ located within the intermediate link memory unit and address $B4_{p00}$ pointing at table $T4_{p00}$ within the main link memory unit.

q is an ordinal index (0, 1, 2, . . . ) for each particular value of p, designating previously stored $L2_p$ values in ascending value order as $L2_{pq}$ values.

r is an ordinal index (0, 1, 2, . . . ) for each particular value of pq, designating previously stored $L3_{pq}$ values in ascending value order as $L3_{pqr}$ values.

s is an ordinal index (0, 1, 2, . . . ) for each particular value of pqr, designating previously stored $L4_{pqr}$ values in ascending value order as $L4_{pqrs}$ values.

Previously stored L4 values are held in one functionally contiguous string within the main link memory unit 14, each L4 designation carrying a pqrs index when shown in a figure. In FIG. 6A values $L4_{pqr0}$ through $L4_{pqrN}$ are stored in value ascending order with ascending address values. As this convention is being followed for all pqr groups the series of composite pqrs numbers is forming a number series in ascending pqrs value order with ascending address values.

The embodiment of FIG. 6A include input means 10, having eight current alphit values $A_0$–$A_7$ within string 32 and four current link values L1–L4 within string 34.

A first link memory unit 12 provides current boundary address values $B2_p$ and $B4_{p00}$, related to the current first link value L1. A main link memory unit 14 holds in store previously stored main link values $L4_{pqrs}$. The intermediate link memory unit 58 has a plurality of storage locations functionally arranged in two column relation tables, 60 & 62. These tables hold value pairs, each comprising a link value and a related address component value. The value pairs are accommodated in two sets of tables, one set of $T2_p$ tables 60 and one set of $T3_{pq}$ tables 62, each table holding one or several value pairs in separate rows thereof. A current second link boundary address value $B2_p$ is used to locate a current second link table and the link values $L2_{pq}$ held within such current second link table are read out for comparison with the current second link value L2. An L2 value matching condition is produced if a previously stored identical second link value $L_{pq}$ is found and an address value is produced, pointing at a current third link table $T3_{pq}$ containing all third link values $L3_{pqr}$ having previously been put in store as related to a previously stored second link value L2. The address value is produced using related address component values $C2_{pq}$ read out from the second link table 60 for determining an off-set value relative the location of the second link table 60. The link value $L3_{pqr}$ held within such current third link table are read out for comparison with the current third link value L3 and an L3 value matching condition is produced if a previously stored identical third value $L3_{pqr}$ is found. A current main link table 64 can now be located, i.e. a table that holds all main link values $L4_{pqrs}$ having previously been put in store as related to the previously stored third link value $L3_{pqr}$. Current boundary address values $B4_{pqr}$ and $B4_{pqr+}$ are produced by adding to the current boundary address $B4_{p00}$ off-set values, each such off-set value being determined from one or more address component values $C3_{pqr}$ read out from the current third link table. The link values $L4_{pqrs}$ that are held within such current fourth link table, are read out for comparison with the current fourth link value L4 and an L4 value matching condition is produced if a previously stored identical main link value $L4_{pqrs}$ is found. Table 64 is searched sequentially according to the alphadecimal numbering shown in FIG. 6A. At number $I^\alpha$ the match is obtained and the related pointer address $P_{pqrI}$ is output.

FIGS. 6B & 6C illustrate two arrangements using different methods for holding in store previously stored address component values within the intermediate link unit 58. Hence different procedures are followed for determining the off-set values. The I/O code-word input represents a sequence formed by the eight most frequently occurring letter symbols of the English alphabet, 'etaonrih'. It is presumed that previously stored link values and address component values represent all possible eight symbol combinations of these eight specific letter symbols, corresponding to 16,777,216 different EKs. The main link memory unit 14 comprises a string of almost 17 million byte storage locations holding a corresponding number of $L4_{pqrs}$ values, along with a string holding related pointer address values. To conveniently cover the wide address range of these strings addressing by means of an off-set from the current boundary address $B4_{p00}$ is employed as described in relation to FIG. 6A. Both arrangements produce, using different procedures, identical off-set address values relative the $B4_{p00}$ address value.

FIG. 6B shows how a match between L2 and $L2_{p9}$ is obtained after a binary search within table 60, comprising the four steps numbered 0, 1, 2 & 3. From the second column are read out all address component values held within rows 0 through 9 and these $C2_{pq}$ values are added, as the integral sign is meant to illustrate. The sum, used as a relative address value, points at table $T3_{p9}$ wherein a value $L3_{p9Q}$, matching the current value L3, is found after a four step binary search. The $B4_{p9Q+}$ value, equivalent to the $B4_{p9R}$ value, can now be produced by a summation of $C3_{pqr}$ values from $C3_{p00}$ through $C3_{p9Q}$ and including $B4_{p00}$ in the summation. $B4_{p9Q}$ is produced by excluding $C3_{p9Q}$ from the summation. Boundary address value $B2_p$ was used to determine where to start the first binary search and where to start the summation of $C2_{pq}$ values. The value $B2_{p+}$ is used only in case table $T3_{pN}$ is involved, determining the end of the $T3_{pN}$ searching range. As shown in FIG. 6B as well as in FIG. 6C $C2_{p0}$ and $C2_{p2}$ values are used to determine the ends of respective current searching ranges.

FIG. 6C shows 16-bit wide second columns within tables 60 & 62, necessary to avoid the two summations described in relation to FIG. 6B. The location of table $T3_{p9}$ is thereby found much faster by direct use of values $C2_{p9}$ and $C2_{pA}$ as pointers relative table $T2_p$. Further, values $C3_{p9P}$ and $C3_{p9Q}$ are used directly as off-set values to be added to value $B4_{p00}$, whereby the output pointer $P_{p9QI}$ is found with minimal delay. As can be seen from FIG. 6B as well as from FIG. 6C, the binary search technique is used also within table 64 in order to avoid unnecessary delays.

FIG. 6D illustrates how an EK system employing bit map memory means is used as a sub-system comprising part of code conversion means in an EK system embodiment that otherwise employs ordinary memory means. The bit map sub-system is used to remove redundant boundary address values from first link memory unit 12 by substituting an ordinal code-word for the part of the small string 34 that otherwise would have been directly assigned as a first link value L1. The set of $L1_p$ values that are represented within memory unit 12 is thereby converted into a non-redundant set of consecutive sequence-numbers. The highest possible $L1_p$ value for the embodiments shown in FIGS. 6A through 6D will be reduced from 65535 to a value depending on the character of the EK set having been previously stored. With the assumptions made in relation to FIGS. 6B & 6C the highest $L1_p$ value is reduced to 1023, whereby first link requirements are reduced from by a factor of 64. The bit map memory would require a 256 byte T1 table, a 64 byte TM1 table, a 512 byte T2 table, a 128*2 byte TM2 table and the small ordinary TM table 54. In FIG. 6D it is presumed that the same eleven EKs as shown in FIG. 3A have been previously stored, one of them, i.e. 'etcetera', being used for current input. For this case the bit map memory requirements are the same except for table T2 and TM2 that are reduced to 24 and 6 bytes respectively. The detailed functioning of the bit map memory system has been illustrated and described in relation to FIG. 3C. The value of the ordinal code-word referred to above, being assigned as the current link value L1, is equivalent to the EKS output of the bit map sub-system. Hence L1 is produced as a count of the number of marked bits within table T2 at bit addresses below the relative bit address $05E^\alpha$, shown in FIG. 6D to represent the current input. As can be concluded from FIG. 6D $L1 = M_{25} + M_{20} + M_{21} = 7$. Without the bit map sub-system L1 would equate (9*32*32+24*32+7)*2=19982.

FIG. 6E shows an embodiment coping with input sequences generating fourteen alphit values without help of an additional link unit, a unit not shown in FIG. 6E because of space limitations. Code conversion is made in two steps like in FIG. 6D, in FIG. 6E illustrated as being performed within first input means 66 and second input means 68, respectively. Within second input means 68 two EK systems in parallel are employed as sub-systems for producing ordinal code-word values, i.e. EKS values, which, when linked together within string 32, uniquely represent the current EK input.

FIGS. 7A-7B relate to EK system embodiments with input means employing code conversion to 4-bit nibble code-words and variable length code-words, respectively. The two embodiments both have code conversion means facilitating compact representation of EK prefix attributes as well as EK suffix attributes.

FIG. 7A illustrates how an input code-word sequence representing the EK 'etching' is converted to a nibble sequence 3D1569F1*, all in accordance with the code schema shown in FIG. 2B. The code conversion control program also executes a search for a compact code-word representation of EK prefix attributes within look-up table 70 and of EK suffix attributes within look-up table 72. The algorithm is shown in the lower left corner of the figure. The first four nibble values 3D15* are fed as a search argument to the prefix table and a value E is returned indicating the number of nibbles that have been allocated a compact nibble value $N_0$. The E=0 response means no prefix found and $N_0$ is returned with the value 0, A value U=4 is returned from the suffix table along with $N_0=1$, indicating that the value $N_0=1$ shall substitute the last four nibbles of the search argument, i.e. the whole of 69F1*, which represents the suffix 'ing'. The four nibble values 3D15* are allocated to $N_4$ through $N_7$ and remaining nibble pairs not required to represent the EK input sequence are allocated a system control code-word value $FD_x$, representing a nullity. Any singular unused nibble would be located in position 7 and given the value $F^x$, also representing a nullity when placed in the last position prior to the nibbles used to represent prefixes and suffixes. The $FD^x$ value is also used as an additional link terminator.

FIG. 7B illustrates how an input code-word sequence representing the EK 'etcetera' is converted to a variable length code-word representation in accordance with the code schema shown in FIG. 2C. No prefix or suffix is found, nevertheless the eight symbol EK can easily be represented by the first three link values. The last two bit positions prior to the nibble positions used to represent prefixes and suffixes are filled up with $11^x$, any sequence of binary ones representing a nullity in this position.

With reference to FIG. 8A, FIG. 7A, FIG. 2C and FIG. 1C the functioning of a preferred embodiment of a file handling system for storing and transferring compressed text files will be explained.

FIG. 8A relates to a text file handling system embodiment employing variable length code-words. In the following such file handling system will be referred to as an FH system. FIG. 8A shows the schema used for encoding and decoding textual words, i.e. ordinary graphic words as they appear within a running text. The text is input to the FH system in form of long sequences of standard I/O code-words, e.g. octet I/O code-words according to ASCII standard.

Each sub-sequence between space separators, i.e. a textual word, is identified by the FH system as an entity, in the following referred to as a file segment. Capitalization of letters and also special signs at the beginning and end of a textual word, e.g. quotation marks, punctuation marks and parenthesis, are taken care of separately using techniques falling outside the scope of the embodiment being described.

For the particular type of text files to be handled by the FH system, e.g. ordinary English texts for general use, the expected frequencies of occurrence have been determined for all frequent segments. The 80 most common segments have been allocated 8-bit RSS code-words $10^x$–$5F^x$ as is shown in FIG. 8A. Also shown are 1280 12-bit RSS code-words for allocation to less frequently occurring frequent segments and 20480 16-bit RSS code-words for allocation to least frequently occurring frequent segments.

Each of the three RSS code-word groups is represented within the embodiment by an EK system embodiment according to FIG. 7A, in the following referred to as segment reference means. Each such segment reference means provides an EKS code-word, in the following named RSS code-word, in response to any valid segment input, i.e. an input equivalent to a previously stored EK. The FH system inputs each file segment in a prescribed order to the three segment reference means until a valid RSS code-word has been produced. In case none of the three segment reference means provides such a response, the FH system selects the 4-bit RSS code-word $0^x$, which means that a particular number of succeeding code-words shall be encoded and decoded according to the code schema shown in FIG. 2C, i.e. a variable length code capable of encoding and decoding any infrequent file segment on a symbol by symbol basis. As is indicated in FIG. 8A, immediately following the RSS code-word $0^x$ is one more 4-bit code-word determining the number of code-words to follow, representing individual infrequent segment symbols.

As all code-words employed within the FH system has the prefix-free property they are concatenated in strings of any length when held in store or being transmitted. It is obvious that single spaces between segments does not require any special representation.

Decoding is performed using the embodiment according to FIG. 7A, however, with a control program adjusted to enable the arrangement to operate in the reversed direction, basically as has been described with reference to FIG. 1C.

What is claimed is:

1. A system for storing a set of entity keys and for providing a response to a subsequent input of an individual entity key code representation, comprising input means for transforming part of a current entity key I/O code-word input into two or more linked digital words, which thereby each attains a current link value and jointly a current overall link value uniquely representing such part of such I/O code-word input, memory means for holding in store link values and address component values related to previously stored entity keys, and control means connected to said input means and to said memory means for determining a current address range for each link succeeding the first one, using at least one current link value to find previously stored address component values to determine the boundaries of such current range, for comparing the current value of each link succeeding the first one with at least one link value previously stored within such current address range, and for producing (i) an overall link value matching condition if, for each link succeeding the first one, the current link value matches a previously stored link value or (ii) an overall link value non-matching condition if the current overall link value is found to fall between overall link values related to previously stored keys.

2. A system as defined in claim 1, wherein each linked digital word comprises a discrete number of digits, i.e. a permanently fixed number for each link position, wherein mandatory links, i.e. a fixed minimum number of links, are used for any input, the last one of which is a main link, wherein a number of additional links are required to fully and uniquely represent such I/O code-word inputs that generate more digits than can be accommodated within the mandatory links, and wherein said input means include 3. A system as defined in claim 2, wherein said memory means include means for producing the overall link value matching condition by examining alternative overall additional link values, should previously stored link values have generated such alternatives individually related to duplicated main link storage locations holding identical current main link values, and wherein said control means include means for outputting, if the overall link value matching condition has been produced upon such examining, an entity key sequence number derived from the relative address of the particular main link storage location being related to the matching alternative.

4. A system as defined in claim 3, having means for generating an entity key I/O code-word output in response to an input of a code representation of a current entity key sequence number, wherein said control means include means for determining the current absolute address of a particular main link storage location, the current relative address of which equals the current entity key sequence number, and for reading from such particular storage location a current main link value, means for searching said memory means for a current main link address range that is encompassing the current absolute address, and for producing current preceding link values as related to the current main link address range, as well as any current additional link values as related to the current main link absolute address, and output means for retransforming the overall link value of the complete series of current link values to a corresponding entity key I/O code-word output.

5. A system as defined in claim 2, wherein said memory means include means for producing the overall link value matching condition by examining alternative overall additional link values, should previously stored link values have generated such alternatives in order to uniquely represent different inputs generating identical overall mandatory link values, and wherein said control means include means for outputting, if the overall link value matching condition has been produced upon such examining, a two part entity key reference number, a main part derived from the relative address of the storage location where the current main link value was found and an additional part derived from the ordinal of the matching member within the set of overall additional link values previously stored as related to such main link storage location.

6. A system as defined in claim 1, wherein said input means include code conversion means for substituting one or more compact code-words for the entity key I/O code-word input, each compact code-word being drawn from a compact code, such compact code not necessarily being the same for each individual position within a succession of compact code-words, for temporarily allocating the overall link value of the compact code-word representation to functionally successive memory cells, and for assigning the contents of such successive memory cells to the linked digital words, not excluding, prior to such assigning, a substitution of one or more ordinal code-words for the contents of one or more sections of such functionally successive memory cells.

7. A system as defined in claim 6, using compact code-words to represent lower-case letters, preferably having been allocated ascending values in progressing alphabetic order, wherein said code conversion means include means for including at the end of the succession of compact code-words a control function code-word to make such succession represent also capital letters, such control function code-word comprising at least one bit and having one value, preferably the highest, when governing an all-lower-case letter sequence and various other values, preferably lower, for alternative capital letter constellations, in particular an extreme value to make the sequence represent an all-capital entity key, whereby such entity key will be positioned correctly within a sequence of entity keys being sorted in overall link value order, and/or means for including at the end of the succession of compact code-words a control function code-word to make such succession represent also an open or hyphened compound, such control function code-word having one value, preferably the highest, when governing a solid compound and other values when governing an exact space or hyphen position, in particular an extreme value to make the sequence represent an open compound with a single letter as the first element, such as 'a priori', and a value next to such an extreme value to make the same succession of compact code-words represent the corresponding hyphened compound, i.e. 'a-priori', or means for including at the end of the succession of compact code-words a control function code-word to make such succession represent also capitalized compounds, still preserving a desirable sorting order by utilizing a wide spectrum of control function code-word values, using an extreme value to govern an all-capital compound open after the first letter, such as 'A PRIORI'.

8. A system as defined in claim 6, wherein said code conversion means include
  means for generating a compact code representation, whereby compact code-words representing frequently occurring entity key I/O code-words, pairs of entity key I/O code-words or larger groups of entity key I/O code-words are made up of fewer bits and in case of less frequent occurrences of larger number of bits.

9. A system as defined in claim 6, wherein said code conversion means include
  means for holding in store a compact code-word representation of at least one entity key attribute set, each such set representing a unique selection of entity key attributes, and
  means for comparing a succession of compact code-words with the compact code-word representation of at least one entity key attribute set and for substituting one specific compact code-word for the specific part of such succession of compact code-words that is equalling the compact code-word representation of a specific entity key attribute, such specific compact code-word being drawn from a compact code being unique for the individual code-word position within the refurbished succession of compact code-words or being unique as governed by a code shift control code-word.

10. A system as defined in claim 1, having storage locations within said memory means provided by read/write type memory devices, thereby facilitating storage of previously not stored entity key I/O code-word inputs, wherein said control means include
  means for presenting a first link reject signal, should the current first link value not generate a succeeding link address range,
  means for presenting a succeeding link reject signal, should a current succeeding link value not match any previously stored link value within the current address range,
  means for executing write instructions in response to a first link reject signal, storing within said memory means, at locations related to the current first link value, address component values essential for determining new address ranges, at least for the next link, inserting within such new address range, for each one of all succeeding links, the current succeeding link value and, except for the last link, storing address component values related to each inserted link value, essential for determining new address ranges, at least for the next link,
  means for executing write instructions in response to a succeeding link reject signal, inserting within said memory means, at a location within such current address range where a current link value turned out not to match any previously stored link value, such non-matching current link value, also inserting within a new address range, for each one of any remaining succeeding links, the current succeeding link value and, except for the last link, storing address component values related to each inserted link value, essential for determining new address ranges, at least for the next one of any remaining succeeding links, and
  means for executing move instructions prior to the insertion of current link values, thereby providing accommodation for such current link values as well as for any related address component values and for adjusting previously stored address component values to conform to any address changes resulting from the execution of such move instructions.

11. A system as defined in claim 1, wherein said control means include
  means for outputting, if the overall link value matching condition has been produced, an address component value previously put in store within said memory means as uniquely related to such overall link value.

12. A system as defined in claim 1, wherein said control means include
  means for outputting, if an overall link value non-matching condition has been produced, an address component value previously put in store as related to an interval including the current overall link value, between adjacent overall link values representing previously stored entity keys.

13. A system as defined in claim 1, wherein said input means include
  code conversion means for producing one ordinal code-word to replace and represent at least one section of a string representation of part of the entity key I/O code-word input, for iteratively producing at least one further ordinal code-word to replace and represent a concatenated digital word formed by linking, in any prescribed order, the ordinal code-word just having been produced with at least one more section of such string, for temporarily allocating the overall value of a last concatenated digital word to functionally successive memory cells, such last digital word being formed by linking, in any prescribed order, the ordinal code-word just having been produced with any remaining sections of the string, and for assigning the contents of such successive memory cells to at least one of the linked digital words.

14. A system as defined in claim 1, transforming an entity key I/O code-word input into at least three digital words, wherein said memory means include
  a first link memory unit for providing current boundary addresses related to current first link values,
  a main link memory unit for holding in store previously stored main link values,
  an intermediate link memory unit, having a plurality of storage locations functionally arranged in two column relation tables for holding value pairs, each such pair comprising a link value and a related address component value, for accommodating the value pairs in one or several sets of tables, one set for each intermediate link, each table holding one or several value pairs in separate rows thereof, and for using at least one current second link boundary address to locate a current second link table,
and wherein said control means include
  means for comparing the link values held within such current second link table with the current second link value, for producing a second link value matching condition if a previously stored identical second link value is found, and for computing an address value pointing at a current third link table containing all third link values having previously been put in store as related to a previously stored second link value, the address value being produced using related address component values extracted from the current second link table for computing an off-set value relative the location of the current second link table or relative a current third link boundary address being obtained from said first link memory unit, for comparing the link values held within such current third link table with the current third link value, for producing a third link value matching condition if a previously stored identical third link value is found, and, provided the link in question is not the main link, an address value pointing at a fourth link values having previously been put in store as related to a previously stored third link value, the address value being produced using related address component values extracted from the current third link table, not excluding the alternative of extracting address component values from preceding third link tables within a sub-set of third link tables related to the current second link table, for computing an off-set value relative the location of the current third link table, relative the location of the current second link table or relative a current fourth link boundary address being obtained from said first link memory unit, and for repeating such functions in an analogous manner link by link until the main link is supposedly being reached.

15. A system for storing a set of entity keys and for providing a response to a subsequent input of an individual entity key code representation, comprising input means for transforming part of a current entity key I/O code-word input into one digital word comprising at least one section, whereby each such section attains a current section value and when linked together a current overall section value uniquely representing such part of such I/O code-word input, bit map memory means for holding in store bit representations of section values related to previously stored entity keys, and control means connected to said input means and to said memory means for finding a current bit location using a current first section value as a relative address value, for reading out the bit value of such location to test if a previously stored entity key has produced a bit mark or not, for producing, upon a bit mark match, a section ordinal code-word from a count of the number of marked bit locations within a bit location address range below or above the address of the current bit location, for outputting an input response if no current section value remains unused, else producing a further relative address value by concatenating, in any prescribed order, the current contents of at least one remaining section with the preceding section ordinal code-word just having been produced, for finding, within an individually section related part of the bit map, a further current bit location using such further relative address value and for repeating iteratively the functioning, section by section, as long as any current section value remains unused and the bit mark match is produced.

16. An arrangement as defined in claim 15, wherein said control means include means for producing marked bit counts by reading out overall binary word values from consecutive bit map sub-areas, each comprising a succession of bit locations, and for using such overall values as entries into a look-up table providing sub-area counts as outputs.

17. A system as defined in claim 15, wherein said memory means include means for holding in store, at least within one section related part of the bit map, a set of marked bit counts, each member of such set representing a count taken within a limited address range, for providing, related to a bit location close to the current bit location, an aggregate count value produced from at least one such limited address range count, and for producing the current section ordinal code-word from such aggregate count value, adding or subtracting a marked bit count produced for the interval between the close and the current bit location.

18. A file handling system for storing and transferring compressed files, each file containing at least one segment, any such segment being either a frequent segment or an infrequent segment, each segment being input to and output from the system encoded into I/O code-words drawn from a distinct I/O code, comprising segment reference means for holding at least one reference segment data set, each such reference segment data set comprising a system representation of a special selection of frequent segments, and for allocating a distinct RSS code-word to each reference segment, such distinct RSS code-word being retrievable for any frequent segment, using the frequent segment as a key, and conversely, any frequent segment being retrievable using a distinct RSS code-word as a key, coding means for substituting one distinct RSS code-word for each distinct sequence of I/O code-words that is representing a distinct frequent segment, each such distinct RSS code-word being retrieved from a specific reference segment data set and applied inside the file handling system as a file code-word, and for substituting a distinct sequence of file code-words for each sequence of I/O code-words that is representing a distinct infrequent segment, such file code words being drawn from a distinct variable length type of code using fewer digits to represent frequently occurring I/O code words, pairs of I/O code-words or larger groups of I/O code-words and a larger number of digits in cases of less frequent occurrences, and decoding means for outputting an I/O code-word representation of a file being retrieved from the system storage or being transferred from another system location, thereby substituting I/O code-words for the file code-words.

19. A file handling system as defined in claim 18, wherein said coding means include means for employing variable length RSS code-words to represent frequent segments, using fewer digits to represent more frequently occurring frequent segments and a larger number of digits in case of a less frequently occurring frequent segments.

20. A method for storing a set of entity keys and for providing a response to a subsequent input of an individual entity key code representation, including the steps of transforming part of a current entity key I/O code-word input into at least two linked digital words, which thereby each attains a current link value and jointly a current overall link value uniquely representing such part of such I/O code-word input, determining a current address range for each link succeeding the first one, using at least one current link value to find previously stored address component values to determine the boundaries of such current range, comparing the current value of each link succeeding the first one with at least one link value previously stored within such current address range, and producing (i) an overall link value matching condition, if for each link succeeding the first one, the current link value matches a previously stored link value or (ii) an overall link value non-matching condition if the current overall link value is found to fall between overall link values related to previously stored entity keys.

* * * * *

UNITED STATES PATENT AND TRADEMARK OFFICE
CERTIFICATE OF CORRECTION

PATENT NO. : 4,782,325                                    Page 1 of 2

DATED : November 1, 1988

INVENTOR(S) : Jeppsson et al

It is certified that error appears in the above-identified patent and that said Letters Patent is hereby corrected as shown below:

```
Column 1,  line 38, change "textural" to --textual--;
           line 39, change "developed" to --Swedish--;
Column 2,  line 13, change "bytes" to --types--;
           line 59, change "these" to --those--;
Column 4,  line 11, change "may" to --map--;
Column 5,  line 29, change "F*,FF*" to --F^X,FF^X--
Column 6,  line 55, change "EX" to --EK--;
Column 9,  line 42, change "Valve" to --Value--;
Column 10, lines 3-4, change "O_o*25-6" to --O_o*256--;
           line 29, change "ranged" to --ranges--;
           line 43, change "T2_i" to --T2_1--;
Column 11, line 13, change "significant" to --insignificant--;
Column 12, line 11, change "closed" to --close--;
Column 14, line 24, delete "a";
Column 15, line 40, change "EKs" to --EKS--;
Column 17, line 22, change "of" to --for--;
           line 30, change "48" to --49--;
           line 54, change "EKs" to --EKS--;
Column 20, line 19, change "C2_p2" to --C2_pa--;
           line 50, change "requirements" to --storage
requirements--;
                    delete "from";
Column 21, line 23, change "3D1569F1*" to --3D1569F1^X--;
           line 30, change "3D15*" to --3D15^X--;
           line 33, change "N_o" to --N_8--;
           line 35, change "N_o=1" to --N_9=1--;
           line 36, change "N_o=1" to --N_9=1--;
           line 37, change "69F1*" to --69F1^X--;
           line 38, change "3D15*" to --3D15^X--;
```

UNITED STATES PATENT AND TRADEMARK OFFICE
CERTIFICATE OF CORRECTION

PATENT NO. : 4,782,325

DATED : November 1, 1988

INVENTOR(S) : Jeppsson et al

It is certified that error appears in the above-identified patent and that said Letters Patent is hereby corrected as shown below:

Column 23, line 24, begin a new paragraph to read as follows:

--means for inserting, within at least one of the mandatory links, specific digits representing a nullity as far as the entity key I/O coding is concerned, should the entity key I/O code-word input not generate sufficient number of digits for the mandatory links to attain defined link values, and wherein said control means include
means for outputting, if the overall link value matching condition has been produced, an entity key reference number derived from the relative address of the main link storage location where the current main link value was found.--;

Column 27, line 7, after "fourth" insert --link table containing all fourth--.

Signed and Sealed this

Third Day of July, 1990

Attest:

HARRY F. MANBECK, JR.

*Attesting Officer*   *Commissioner of Patents and Trademarks*